United States Patent [19]
Ohmi et al.

[11] Patent Number: 5,714,795
[45] Date of Patent: Feb. 3, 1998

[54] SEMICONDUCTOR DEVICE UTILIZING SILICIDE REACTION

[75] Inventors: Tadahiro Ohmi, 1-17-301, Komegabukuro 2-chome, Aoba-ku, Sendai-shi, Miyagi-ken 980; Hiroshi Suzuki; Masaki Hirayama, both of Sendai, all of Japan

[73] Assignee: Tadahiro Ohmi, Japan

[21] Appl. No.: 554,053

[22] Filed: Nov. 6, 1995

[30] Foreign Application Priority Data

Nov. 11, 1994 [JP] Japan .................. 6-277995

[51] Int. Cl.$^6$ .................. H01L 29/00; H01L 29/04; H01L 23/48
[52] U.S. Cl. .................. 257/530; 257/52; 257/754; 257/768
[58] Field of Search .................. 257/52, 530, 768, 257/754

[56] References Cited

U.S. PATENT DOCUMENTS

| | | |
|---|---|---|
| 5,381,035 | 1/1995 | Chen et al. .................. 257/530 |
| 5,493,147 | 2/1996 | Holzworth et al. .................. 257/530 |
| 5,543,656 | 8/1996 | Yen et al. .................. 257/530 |
| 5,557,136 | 9/1996 | Gordon et al. .................. 257/530 |

FOREIGN PATENT DOCUMENTS

| | | | |
|---|---|---|---|
| 501120 | 9/1992 | European Pat. Off. .................. 257/530 |
| 57-106084 | 7/1982 | Japan .................. 257/52 |
| 61-91968 | 5/1986 | Japan .................. 257/52 |
| 2-78273 | 3/1990 | Japan .................. 257/52 |

*Primary Examiner*—Jerome Jackson
*Assistant Examiner*—T. M. Arroyo
*Attorney, Agent, or Firm*—Baker & Daniels

[57] ABSTRACT

A semiconductor storage device capable of high-speed writing and reading and having extremely high reliability. The semiconductor device includes a plurality of cells each having a semiconductor layer between a pair of conductors. At least one of the pair of conductors is made of a metal and the semiconductor layer is made of a-Si which forms a silicide region having a width of 150 nm or less by silicide reacting with the metal at a reaction speed of 10 m/sec or higher. Alternatively, at least one of the pair of conductors is made of a metal which silicide reacts with a-Si to form a silicide region having a conical structure with a diameter of 150 nm or less. Otherwise, at least one among the pair of conductors is formed of a metal which forms a silicide region of 150 nm or less by reacting with a-Si. The interface between the semiconductor layer and the conductors is not exposed to an external oxygen containing atmosphere during processing so that no oxygen containing compound exists at this interface.

37 Claims, 28 Drawing Sheets

SEMICONDUCTOR DEVICE UTILIZING SILICIDE REACTION

TECHNICAL FIELD

The present invention relates to a semiconductor memory device, and provides a function of electrically connecting wirings by means of reaction induced by a current or heat, and in particular various high performance semiconductor devices such as a highly integrated/high speed read only memory, a high speed field programmable device and the like.

BACKGROUND ART

Which wirings in an LSI are connected/insulated are usually determined by a mask during processing and this connection of the wirings determines the function of a circuit. However, since the function of a circuit thus manufactured is unequivocally determined after IC processing and cannot be put to other uses, it must be individually made depending on each use. For this reason, mass production has been impossible. Also, it has been necessary to design a mask for determining interwiring connection for each IC, requiring more time from designing to manufacturing.

Thus, if connection and insulation of wirings among operating elements can be arbitrarily determined after IC processing is finished, it will be possible, by mass-producing elements beforehand, to write a circuit function by means of wiring connection each time according to a necessary function, and consequently this will make it possible to supply a requested IC inexpensively and quickly. Conventionally, there have been available fuse and antifuse methods in order to allow arbitrary determination of interwiring connection and insulation after IC processing is finished. The fuse method is one of causing an optional spot to an insulated state by connecting all the wirings by means of fuse elements (polysilicon) at the time when IC processing is finished beforehand and cutting this connection by means of a current. By this method, however, malfunction may occur due to scattering of cut polysilicon. In addition, since resistance of uncut polysilicon is made small, it is difficult to attain a high speed for a circuit operation. The antifuse method is one of connecting wirings by breaking down an insulating film. It is difficult to attain a high speed for a circuit operation because of big resistance after connection. Moreover, a connected part becomes a fuse after connection and it is impossible to maintain a stable connected state due to a cut thereof, leading to a lack of reliability.

Thus, a highly reliable technique to connect wirings having small resistance after connection is required for the antifuse method which produces no wastes. Although in recent years researches have been made in an antifuse utilizing amorphous silicon, a voltage inducing a breakdown is big and it has been impossible to stably maintain sufficiently lowresistance after connection for a long time. Also, there is a case where an FN (Fowler-Nordheim) current begins to flow when an electric field is applied and power consumption by a system during operation increases. Thus, sufficient performance has not been provided.

On the other hand, it is possible to realize a memory in which writing is allowed after IC processing is finished by using the above connecting technique. Films, videos, music software and the like will, once they are written, be repeatedly read thereafter and thus need not be rewritten. In this sense this can be called a read only memory.

Much of information including these films, videos, music, etc., is stored in a magnetic tape or a compact disk. For a method using a magnetic tape or a compact disk, however, a mechanical structure for bringing a reading sensor close to the magnetic tape or a disk surface and rotating the tape or the disk at a high speed is necessary. It is difficult to miniaturise a reading device and a reading speed is determined depending on a mechanical rotational speed, making it harder to read a large quantity of data at a high speed. Also, a long time is needed for writing.

Therefore, it is necessary to provide a compact storage medium capable of reading and writing at a speed higher compared with a magnetic medium, etc., and not needing a mechanical rotational part in a reading/writing device. As a storage medium for realizing this, there is available a read only memory (ROM) manufactured by IC processing and capable of electrically reading. As a memory of this type, there are a mask ROM for storing information by a mask during an IC manufacturing process, a fuse ROM for cutting a fuse element (polysilicon) and storing information by means of a current after IC chip manufacturing and an antifuse ROM for breaking down an insulator, causing it to be a conductor and storing information similarly by means of a current.

In the case of the mask ROM for storing information by the mask during an IC manufacturing process, however, a new mask must be manufactured according to information to be written, and thus it requires a great deal of time until completion of a product, increasing manufacturing costs in a small-scale production.

In the case of the fuse ROM, as described above, since a current flowing through a memory element in which "1" is stored is limited small by means of an uncut fuse (highly resistant polysilicon), high-speed reading is difficult. There is also a problem of malfunction caused by dusts generated at the time of fuse cutting. In the case of the antifuse ROM for storing information by breaking down the insulator and causing it to be a conductor, it is difficult to make small resistance after breaking down, and as a result a current flowing through the memory element in which "1" is stored is made small making it harder to perform high-speed reading. An antifuse ROM is disclosed, for instance in a report from K. E. Gordon, R. J. Wong ("CONDUCTING FILAMENT OF THE PROGRAMMED METAL ELECTRODE AMORPHOUS SILICON ANTIFUSE", IEDM27–30, 1993) or in a Japanese Laid-Open Patent No. 62-49651.

It is thus clear that the above-described conventional techniques are not sufficient in order to keep up with an increase in an information accessing speed likely to be required in the future and to provide good quality semiconductor memory.

In particular, writing and reading speeds must be further increased and the possibility of malfunction erroneous information reading) generation must also be further reduced.

Under these circumstances, it is an object of the present invention to provide a highly reliable and inexpensive semiconductor memory device capable of high-speed reading and writing, making it difficult for malfunction to occur.

SUMMARY OF THE INVENTION

A semiconductor device utilizing a silicide reaction provided by the invention is characterized in that in the semiconductor device in which a plurality of cells having a semiconductor layer between a pair of conductors are disposed, at least one among the pair of conductors is made of a metal and the semiconductor layer is made of amorphous silicon capable of forming a silicide region having a width of 150 nm or less by means of a silicide reaction with the metal at a speed of 10 m/sec or higher.

The semiconductor device utilizing a silicide reaction provided by the invention is also characterized in that in the semiconductor device in which a plurality of cells having a semiconductor layer between a pair of conductors are disposed, the semiconductor layer is made of amorphous silicon, at least one among the pair of conductors is made of a metal which creates a silicide reaction with the amorphous silicon and a formed silicide region is structured in a conical form having a diameter of 150 nm or less.

The semiconductor device utilizing a silicide reaction provided by the invention is further characterized in that in the semiconductor device in which a plurality of cells having a semiconductor layer between a pair of conductors are disposed, the semiconductor layer is formed of amorphous silicon, at least one among the pair of conductive layers is formed of a metal capable of forming a silicide region having a width of 150 nm or less by reacting with the amorphous silicon and a surface on which a film is formed is manufactured without being exposed to oxygen atmosphere during the process of forming the amorphous silicon to that of forming the metal.

FUNCTION

The inventors have found, as a result of detailed researches into causes of preventing reduction in the break down voltage of an antifuse and a resistance value after connection, that impurities such as oxygen and the like existent on a border surface between the amorphous silicon and the metal give great effects. The inventors have also found that the reliability of the antifuse after connection greatly depends on the width of a formed silicide region. The invention has been completed based on these findings.

According to the invention, a cell having a silicide region in which a silicide reaction has progressed at a speed of 10 m/sec or higher has low resistance and can stably maintain a conductive (breakdown) state for a long time.

The amorphous silicon which can obtain the above-described reaction speed has a low reaction value in a nonconductive (nonbreakdown) state and less current leakage. It is also possible to make small a possibility of erroneous writing (breakdown) by the writing operation of the other cell.

The silicide region of the cell made conductive (breakdown) and low in resistance is not formed in a shape in which crystal grains are randomly collected but in a conical or a truncated (pyramid) shape, and thus the cell is placed in an electrically stable state having low conductive resistance.

The size of a silicide region formed when the film thickness of the amorphous silicon is set to 150 nm or less and a current flowing at the time of forming a silicide is set to 30 mA or less is 150 nm or less in its width. Since an internal stress generated at the time of forming the silicide can be made small, the reliability of the cell after connection is improved and the rate of failure generation is made extremely small even after use for a long time.

The width of the silicide region in the invention means the length of a diagonal on a bottom surface square in the case of a truncated shape. It means the diameter of a bottom surface circle in the case of a conical shape.

Furthermore, as a result of continuously forming semiconductor layers and metals which create silicide reactions without exposing a processed base to air containing oxygen, a border surface characteristic is improved and it is easy to form the silicide area of a conical form at a reaction speed of 10 m/sec. or higher.

Also, when the resistance of the semiconductor layer (hereafter called "first semiconductor area") composing a memory element, an antifuse to be made conductive, is $R_1$, a silicide reaction speed is V1, the resistance of a second semiconductor area in which a flow rectifying barrier for composing a flow rectifier is generated is $R_2$ and a silicide reaction speed is $V_2$, the device is structured so as to satisfy a relationship $R_1 > R_2$ and/or $V_1 > V_2$, and thereby it can be maintained for a long time without impeding a flow-rectifying function.

EMBODIMENT EXAMPLE

The preferred embodiments of the invention will now be described in detail.

FIG. 1 is a circuit diagram showing an example of a semiconductor memory device of the invention.

A cell for storing "0" or "1" is provided, in addition to a memory element AF which is an antifuse to be made conductive, with a MOS transistor Tr which is a switch element provided when necessary. In each cell reading and writing operations are executed by means of selecting a word line 3 or 4 and a bit line 1 or 2.

FIG. 2 is an exemplary sectional view showing the structure of the memory element AF part shown in FIG. 1. In the drawing, a reference numeral 5 is a semiconductor base constructed by a silicon substrate, etc., in which the MOS transistor shown in FIG. 1 and the like are formed. 6 is the $n^+$ drain of the MOS transistor Tr constructed by a silicon layer, etc., in which phosphorus and arsenic are doped. 7 is an insulating film of $SiO_2$, etc. 8 is a semiconductor layer formed in the contact hole of the insulating film 7 and is in contact with the $n^+$ drain area 6 of the substrate. 9 is a conductor for forming a silicide region by silicide reacting with the semiconductor layer 8. 10 is wiring for connecting the conductor 9, equivalent to the bit lines 1 and 2 in FIG. 1.

In the invention, the memory element AF of a selected cell is made conductive by applying a voltage equal to or higher than a threshold value between the $n^+$ drain 6 and the conductor 9. Heat generated by a current caused to flow by means of electric conductivity generates a silicide reaction between the semiconductor layer 8 and the conductor 9, or promotes it and forms an electrically stable conductive state.

In particular, when the memory element AF is broken down by connecting a constant current source (not shown in the drawing) for flowing a constant current of 100 mA to the bit lines 1 and 2, materials for the semiconductor layer 8 and the conductor 9 and/or a manufacturing method are selected so as to allow the silicide reaction to progress at a speed of 10 m/sec (10 meters per one sec.).

As a material for the semiconductor layer 8, it is preferable to use amorphous silicon in which the minute amount of non-doped or P type dopant boron is doped. It is also preferable that the amorphous silicon is hydrogenated or halide silicon containing hydrogen or halide atoms. It is further preferable that the amorphous silicon is silicon formed by means of a method of eliminating oxygen introduced against will by contamination, etc., as much as possible.

As a material for the conductor 9, among so-called high melting point metals, one which makes a silicide reaction favorably with the amorphous silicon is used. Specifically, the metal is a single tungsten (W), titanium (Ti), tantalum (Ta), molybdenum (Mo), cobalt (Co), hafnium (Hf), nickel (Ni), zirconium (Zr), chromium (Cr), vanadium (V), palladium (Pd) or platinum (Pt), an alloy of these materials, or a compound using these materials as main components.

Though the conductor 9 is formed only on the upper surface of the semiconductor layer 8 in the example in FIG. 2, it is predetermined that it is also provided on the bottom surface thereof. If there are conductors made of the above-described materials on both upper and bottom surfaces, a writing speed is further increased because the silicide reaction progresses on both upper and lower parts and thus conductive resistance is further reduced. Also, since a silicide reaction occurs irrespective of the polarity of an applied voltage, freedom of designing a driving circuit is expanded.

If the direction of a current for generating reaction between the metal and the semiconductor is set so that electrons flow from a metal layer to an amorphous semiconductor layer side, metal atoms move into the amorphous semiconductor more easily by means of the flow of electrons and thus resistance of the amorphous silicon area can be made low efficiently.

Selection of either W or Ti as a metal is particularly advantageous because an amorphous silicon film can be more easily formed selectively on the W or the Ti in low temperature in which no reaction between the metal and the amorphous silicon occurs, films can be continuously formed on the antifuse by self-alignment and thus the antifuse having a highly cleaned border surface can be manufactured with the small number of masks.

The thickness of the amorphous semiconductor layer is determined by specifications of a breakdown voltage, etc. It is predetermined to be 50 nm to 200 nm because of a relationship with a peripheral circuit. However, it must be 150 nm or less in order to further improve the reliability of a formed silicide region. The thickness of the metal must be sufficiently large for compound forming reaction with the semiconductor, and if W is selected for the metal and amorphous silicon is selected for the semiconductor, $WSi_2$ is formed by the reaction of the amorphous silicon having a film about 3.6 times as thick as that of the metal and thus the film of the W must be at least about 0.3 times as thick as that of the amorphous silicon. If Ti is selected for the metal and amorphous silicon is selected for the semiconductor, $TiSi_2$ is formed by the reaction of the amorphous silicon having a film about 3.2 times as thick as that of the metal and thus the film of the Ti must be at least about 0.3 times as thick as that of the amorphous silicon in this case as well.

Furthermore, a function as a memory cell is provided by adding a structure having a flow-rectifying function in series to the amorphous semiconductor area. The structure of this memory cell is simple and can be arrayed at the intervals of wirings, thus making it possible to realize ROM of an extremely high density.

Also, since the semiconductor device of the invention can be manufactured by complete self-alignment, a manufacturing process can be simplified and ROM of a high recording density can be easily manufactured.

In the circuit in FIG. 1, three terminal cell using transistors as switching elements is shown. According to the invention, however, a two terminal cell can be used having a structure using only the memory element AF on an intersecting portion between the word line and the bit line or that laminating diodes as memory elements and flow-rectifying elements on the intersecting portion.

As a method of forming the semiconductor layer of the invention, there are available a plasma CVD method by glow discharging using silane as a gaseous starting material and a sputtering method in atmosphere containing hydrogen gas.

As gas used for the plasma CVD method, one or two or more selected from $SiH_4$, $Si_2H_6$, $SiF_4$, $SiCl_4$, $SiHCl_3$, $SiH_2Cl$, etc., are used in combination, and gas such as $H_2$, Ar, $B_2H_6$ and the like is used when necessary.

In the case of the sputtering method, highly pure single crystal is used as a targeted starting material and sputtering is carried out in atmosphere containing $H_2$ and Ar. More preferably, a bias sputtering method for controlling the movement of atoms sputtered by applying a bias may be used. Conditions for forming films in these methods will be described in detail when each embodiment is explained.

As a method of manufacturing conductors, there are available a vapor deposition method, a sputtering method and a CVD method. As in the case of the above-described method of manufacturing the semiconductor made of amorphous silicon, however, a bias sputtering method is preferable.

In particular, if the conductor and the film of the semiconductor are formed by using the same chamber or a multichamber capable of moving a substrate without exposing it to air containing oxygen, the characteristic of a border surface between the conductor and the semiconductor is improved and a silicide reaction occurs repeatedly.

A silicide region formed by reaction between the semiconductor and the metal in which unintentionally introduced impurities are reduced as much as possible and a cell broken down by a relatively low voltage is generated is formed conical such as pyramid, cone, truncated and the like.

A cell in which resistance between a pair of conductors is made low (short) by means of this conical silicide region is stable and highly reliable allowing high-speed reading.

Furthermore, the shape of the silicide region formed when the thickness of the amorphous silicon film is set to 150 nm or less and a current caused to flow at the time of forming a silicide is set to 30 mA or less is conical having a diameter of 150 nm or less. A cell in which resistance between a pair of conductors is made low (short) by means of this silicide region is highly reliable and a rate of generating failures after long time use is extremely small.

FIG. 29 is a sectional view showing the form of the silicide region of the cell of the invention and the silicide region of a conventional cell. In the drawing, reference numerals 642 and 644 are conductors made of a metal (Ta), 643 and 643' are amorphous silicon layers and 645 and 645' are tantalum silicide layers.

On a silicide layer in FIG. 29(c), since the positions and forms of crystal grains are unstable because of migration, reproductivity is poor. On a silicide layer in FIG. 29(b), a volume change due to a silicide reaction is big, failures are generated after long time use by an internal stress thereby generated and thus sufficient reliability is not provided after connection. The silicide layer of the invention in FIG. 29(a) is low in resistance, stable and highly reliable.

Next, the electrical characteristic of the cell of the invention will be described. FIG. 3 shows a sample cell of the invention made for the purpose of measuring electrical characteristics. In the sample, tungsten 15 and nondope amorphous silicon 14 are laminated on a silicon substrate 18 and tungsten 12 and a wiring 11 are laminated in a contact hole provided on an insulating film 13. 17 is a DC power source and 16 is a resister.

FIG. 4 shows a result of experiment when writing is carried out. In the drawing, an abscissa indicates voltages applied between an electrode 11 and the substrate while an ordinate indicates currents caused to flow then. A characteristic 19 shows that high resistance silicon has broken down due to application of a voltage of 17V. It is clear that a current after breakdown is given an upper limit by a protective resister 16 of 1 KΩ and changed according to a characteristic indicated by current=voltage/1KΩ.

A characteristic 20 is a result of measuring a current by applying a voltage again after the characteristic 19 is measured. The current changes according to a characteristic indicated by current=voltage/1 KΩ from the start. That is, the high resistance silicon layer has already changed to a low resistance layer. Resistance which was several GΩ or higher has been made very small, a level of 50 Ω. From these results, it is clear that it is enough to set a writing voltage at, for instance 20V in this case.

Next, it will be shown that amorphous silicon is suited to manufacturing an antifuse. FIG. 5 shows a result of measuring resistance of an antifuse after writing using a polycrystal and amorphous silicon. A method of experiment is the same as in the above. However, a sample in which the film of polycrystal silicon is formed instead of the amorphous silicon was manufactured and both were compared. A condition for forming a film of polycrystal silicon was that $SiH_4$ was 1 sccm and Ar 320 sccm, and plasma of 10 mTorr was excited by applying 180 MHz and 150 W to an electrode for exciting plasma. A substrate was a floating type and temperature was set at 300° C. Ion energy for illuminating the substrate at this time was 25 eV and a film forming speed was 1 nm/min. Film formatting lasted for 100 min.

Characteristics 21 and 22 indicate current-voltage characteristics after breakdown when amorphous and a polycrystal are used. It can be understood that the characteristic using the amorphous shows ideal linear resistance and a resistance value is a low 50 Ω. On the other hand, the characteristic 22 using the polycrystal shows nonlinear resistance and a resistance value is big, over 1 kΩ.

FIG. 6 shows current-voltage characteristics when breaking-down of amorphous silicon and polycrystal silicon is performed. Characteristics 24 and 23 indicate current-voltage characteristics during writing when amorphous and a polycrystal are used. It is clear from these that compared with the characteristic 23 using the polycrystal a tunnel current for the characteristic 24 using the amorphous during writing is smaller.

A limitless number of antifuses not to be written exist in a large size circuit and thus the sum of such leaked currents is large for the whole circuit. It will also lead to an increase in power consumption, making it difficult to apply these to a large size circuit. It is clear from this that it is better to form an antifuse of amorphous silicon.

FIG. 7 shows an experimental circuit used for causing breakdown by means of a pulse. 36 is an antifuse, and this measurement used genuine amorphous silicon having a film thickness of 50 nm. 34 is JFET, and in this case it works as a constant current source determined by the voltage value of a voltage source 38. In this experiment, when the voltage of 38 is set at 0V, the JFET works as a current source of 7 mA. 30 is a pulse generator and resisters 31 and 35 are for obtaining compatibility to limit reflective waves during high-frequency measuring. A parasitic capacity of 35 pF is inserted into the antifuse 36 in parallel. 32 is an oscilloscope, which measures voltages applied to both ends of the antifuse via a high-frequency probe 33 having an input capacity of 1.7 pF and an input impedance of 10 MΩ.

FIG. 8 shows a result of the measurement. 40 is a waveform of an input pulse, and a pulse of 250 nsec and 10V was inputted. 41 is a voltage applied to the antifuse when a pulse is inputted only once, and it is clear that breakdown occurs at about 9V. A voltage applied to the antifuse immediately after breakdown is 1.16V, and from this value the resistance 155 Ω of the antifuse is obtained at this time. 42 is a change in a current applied to the antifuse when a pulse is inputted for the second time. It is cleat that the antifuse is electrically short-circuited from the beginning at 155 Ω. This means that the antifuse is placed in a stable conductive state by one-time writing.

FIG. 9 is an expanded view of a voltage change the moment breakdown occurs at the time of first pulse inputting. 44 shows occurrence of breakdown. A voltage is reduced thereafter and stabilized almost at a constant value as shown by 45. Thus, once breakdown starts to occur, the antifuse is placed in a conductive state within 1 nsec. This is a speed faster by 2 digits or more than that for normal antifuse writing and is an effect of realizing a highly clean border surface. It is clear that in this wiring a silicide reaction is carried out at a reaction speed of 10 m/sec or higher.

In FIG. 8, a time from the input of the pulse to the end of writing is about 50 nsec. However, the major part of this time is one for charging the parasitic capacity of 35 pF by means of a current source of 7 mA, and an actual writing time is 1 nsec. as described previously. The current driving performance of the JFET must be increased more in order to make the whole writing time faster. Moreover, by making the parasitic capacity small by means of micronizing, a charging time is made short and a writing time can be made short as well.

The JFET was used in the above case. However, by changing this to a normal CMOS inverter, a gate pulse can be driven by the pulse generator. A voltage is also supplied, in this case, from a power source to the antifuse through a PMOS transistor and thereby breakdown can be induced. It is also easy to realize the operation of a PMOS as a current source of 7 mA used in the above experiment. Moreover, a current driving performance can be easily improved by means of device designing.

FIG. 32 shows a result of evaluating the reliability of the antifuse after writing. For the purpose of comparison the life of a standard Al wiring is shown in FIG. 32(a). The life of a wiring in FIG. 32(b) is longer compared with that in FIG. 32(a), but variance is bigger. FIG. 32(b) shows a rate of failure occurrence of a cell in which a silicide region having a width of 200 nm is formed by supplying a current of 38 mA to an antifuse having amorphous silicon film thickness of 230 nm. On the other hand, in FIG. 32(c) showing the life of a cell in which a silicide region having a width of 100 nm is formed by supplying a current of 8 mA to an antifuse having amorphous silicon film thickness of 70 nm, an average life is longer compared with (a) and (b) in each temperature and variance is smaller.

The antifuse of the invention utilizes a silicide reaction, and therefore a stress is generated due to a volume change during reaction. When this stress increases, the silicide region is made unstable after writing, which is a cause of variance. It is effective to limit a volume change by making small a part in which reaction occurs in order to prevent the generation of a stress during silicide forming. By limiting the amorphous film thickness to 150 nm or lower and setting a current supplied during silicide forming at 30 nmA or less, a small silicide region is formed, making it possible to perform highly reliable writing. Moreover, by using as a metal material either one of W, Ta, Ti, Co, Mo, Hf, Ni, Zr, Cr, V or Pd for forming a silicide by reacting with the amorphous silicon, low resistance can be stably obtained in the small silicide region.

FIG. 33 shows failure occurrence rates after writing when silicide regions of various sizes are formed. It is apparent that when the width of a silicide region surpasses 150 nm, the life of a formed silicide region deteriorates. On the other hand, in a case where a silicide region having a width of 150 nm or less is formed, the life thereof is longer than that of the normal Al wiring, showing an improvement in reliability. By limiting the amorphous film thickness to 150 nm or less and setting a current supplied during silicide forming at 30 mA or less, highly reliable antifuse writing can be performed.

(Description of the Reference Numerals)

Figure 1:
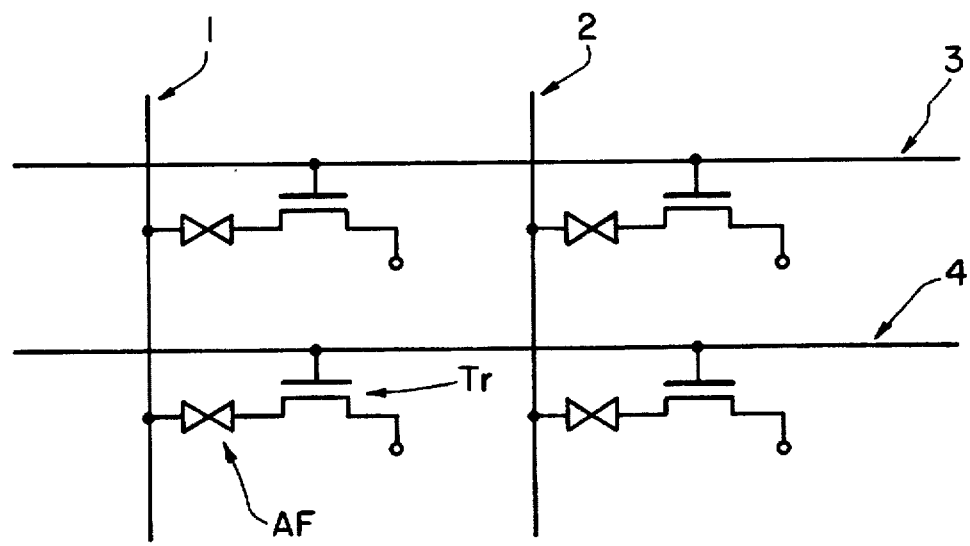
FIG. 1 is a circuit diagram showing an example of a semiconductor device of the invention.

1, 2. BIT LINE
3, 4. WORD LINE
5. SEMICONDUCTOR BASE PLATE
6. N$^+$ DRAIN PART
7. INSULATING FILM
8. CONDUCTIVE SEMICONDUCTOR LAYER
9. CONDUCTOR FOR FORMING SILICIDE REGION
10, 11. WIRING
12, 15. TUNGSTEN
13. INSULATING FILM
14. AMORPHOUS SILICON
16. RESISTER
17. DC POWER SOURCE
18. SILICON BASE PLATE
19. CURRENT AND VOLTAGE CHARACTERISTIC DURING WRITING
20. CURRENT AND VOLTAGE CHARACTERISTIC AFTER WRITING
21. RESISTANCE AFTER ANTIFUSE WRITING USING a-Si
22. RESISTANCE AFTER ANTIUSE WRITING USING polySi
23. CURRENT AND VOLTAGE CHARACTERISTIC DURING ANTIFUSE WRITING USING polySi
24. CURRENT AND VOLTAGE CHARACTERISTIC DURING ANTIFUSE WRITING USING a-Si
30. PULSE GENERATOR
31. RESISTER (50 Ω)
32. DIGITAL OSCILLOSCOPE
33. PROBE
34. JFET
35. RESISTER (100 Ω)
36. ANTIFUSE
37. PARASITIC CAPACITOR (35 pF)
38. POWER SOURCE
40. INPUT PULSE
41. VOLTAGE APPLIED TO ANTIFUSE DURING FIRST PULSE INPUTTING
42. VOLTAGE APPLIED TO ANTIFUSE DURING SECOND PULSE INPUTTING 43. VOLTAGE APPLIED TO ANTIFUSE DURING 100th PULSE INPUTTING
50. BASE PLATE 50
53. AMORPHOUS SILICON FILM
54, 54'. TUNGSTEN (W) FILM
55. Al—Si—CU WIRING
60, 60'. WORD LINE
62, 62'. BIT LINE
68. p$^+$ LAYER
69. p$^-$ LAYER
70. n$^+$ LAYER
71. METAL LAYER
72. AMORPHOUS SILICON LAYER
201, 203, 207, 211, 213, 217. METAL
202, 212. P TYPE AMORPHOUS SILICON
204, 205, 216, 222, 223. P TYPE POLYCRYSTAL SILICON
206, 214, 215, 221. N TYPE POLYSRYCTAL SILICON
220. METAL LAYER
224. OXIDIZED FILM
225, 227. METAL LAYER
226. SEMICONDUCTOR LAYER
230. BASE PLATE
231. METAL
232. INSULATING FILM
233. P TYPE POLYSILICON LAYER
234. P$^+$ POLYSILICON LAYER
235. W FILM
236. a-Si FILM
237. W FILM
251, 252. METAL WIRING
253, 254. CONDUCTOR WIRING
255, 256, 257, 258. AMORPHOUS SEMICONDUCTOR
261, 262. VOLTAGE SOURCE
270, 271, 273, 274. RESISTER
281, 282. BIT LINE
283 TO 285. WORD LINE
286 TO 288. DIODE
289 TO 291. CONTROL GATE
292. FLOATING GATE
300. SILICON BASE PLATE
301. SiO$_2$
302. INTERLAYER INSULATING FILM
303. P TYPE POLYSILICON FOR FORMING PN DIODE
304. METAL TO BE SILICIDED
305. AMORPHOUS SILICON TO BE SILICIDED
330 TO 337, 343 TO 347. I/O WIRING
339, 340. INVERTER
341, 342. 2 INPUT AND CIRCUIT
348. 2 INPUT OR CIRCUIT
349. METAL LAYER
350. AMORPHOUS SEMICONDUCTOR LAYER
382 TO 385. WIRING
386. N$^+$ LAYER
387. P LAYER
388. AMORPHOUS SEMICONDUCTOR LAYER
389. METAL LAYER
390, 391, 392, 393. SWITCH
370, 373, 401, 410, 413. NODE
402, 403, 407, 408, 409. TRANSISTOR
405. OUTPUT TERMINAL
450, 454, 458, 462. SWITCH
453, 454, 458, 462. SWITCH
453, 456. WORD LINE
460, 464. BIT LINE
470 TO 473. PN DIODE
475, 477, 479, 481. INVERTER CONSTITUTING SENSE AMPLIFIER
482, 483. WIRING
493, 494. INVERTER
485, 486, 487, 488. AND CIRCUIT
501, 511. WORD LINE
503 TO 510, 513 TO 520. SWITCH AND PN DIODE
525, 526, 527, 528. BIT LINE
502, 512. INVERTER
521 TO 524. INVERTER
521 TO 524. SWITCH
529, 530, 531, 532. INVERTER
533 TO 536. OUTPUT LINE
538 TO 541. COMBINATION OF SWITCH AND DIODE
605, 620. UNUSED PART
608, 616, 621, 622, 623, 624. WIRING
626. ROM
627. OUTPUT LINE
642, 644. TANTALUM
643, 643'. AMORPHOUS SILICON
645, 645'. TANTALUM SILICIDE
850. DETECTING CIRCUIT
859 TO 861. BIT LINE
858. WORD LINE
862. NMOS
863, 864. PMOS
901. PMOS
902, 903. ELECTROSTATIC CAPACITOR
906. MEMORY CELL
910. WORD LINE
911. BIT LINE

BEST MODE FOR CARRYING OUT THE INVENTION

The invention will now be described in detail with reference to the preferred embodiments. It is needless to say, however, that application of the invention is not limited to these embodiments.

(Embodiment 1)

Figure 2:
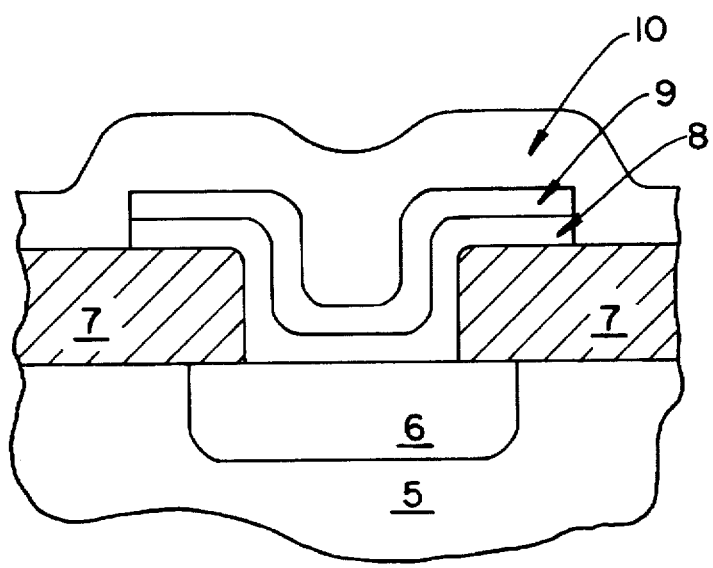
FIG. 2 is an exemplary sectional view showing an antifuse (memory element) of the invention.
Figure 3:
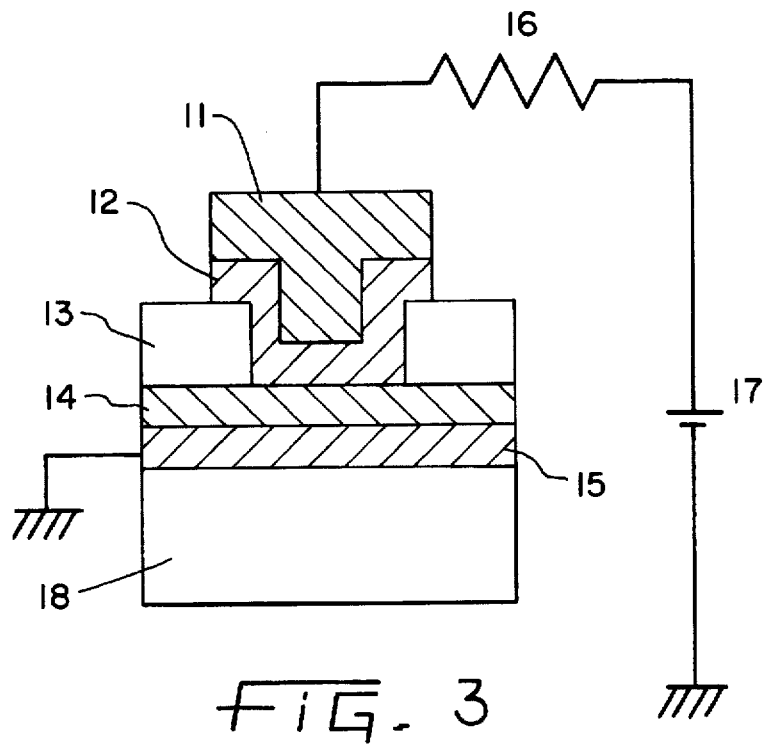
FIG. 3 is an exemplary sectional view showing a cell used for measuring electrical characteristics.
Figure 4:
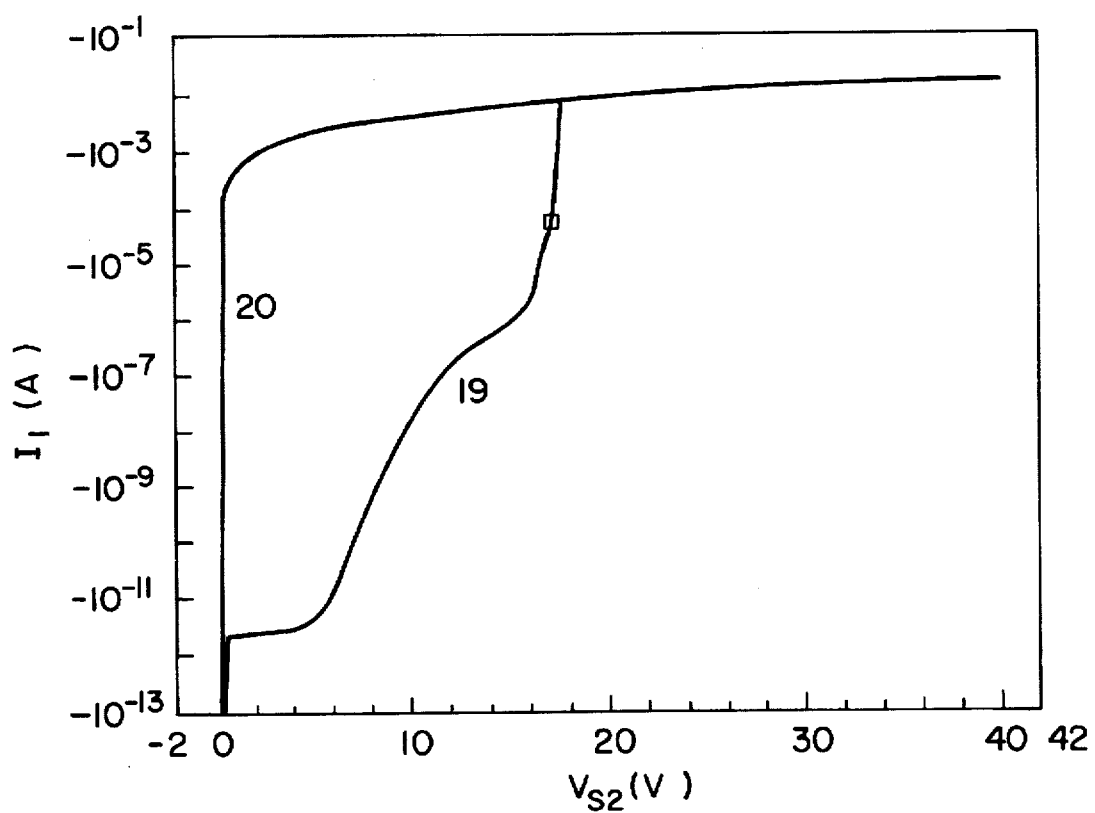
FIG. 4 is a graph showing voltage-current characteristics during writing.
Figure 5A:
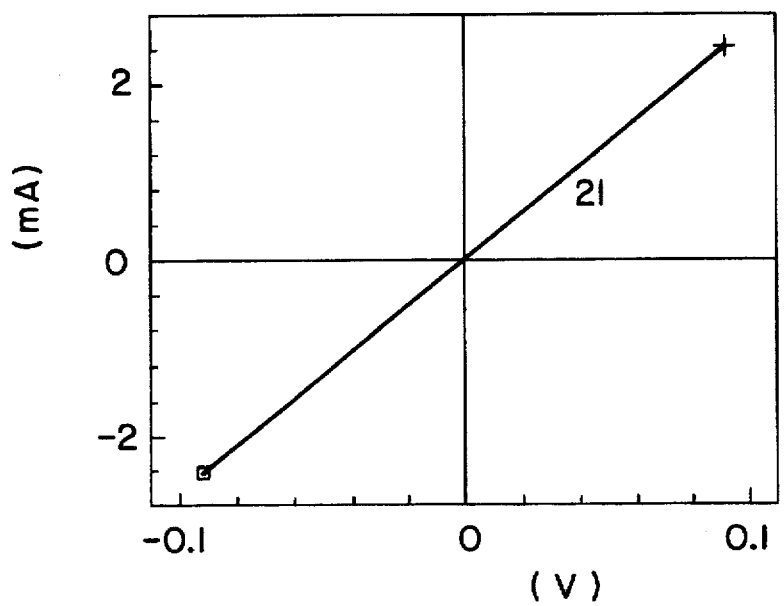
FIG. 5 is a graph showing resistance after writing for a-Si and polySi.
Figure 5B:
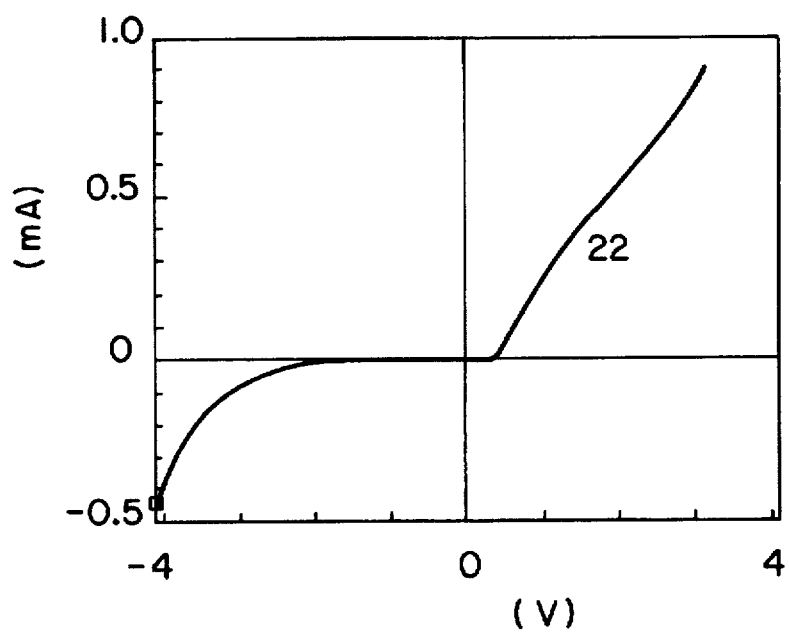
Figure 6:
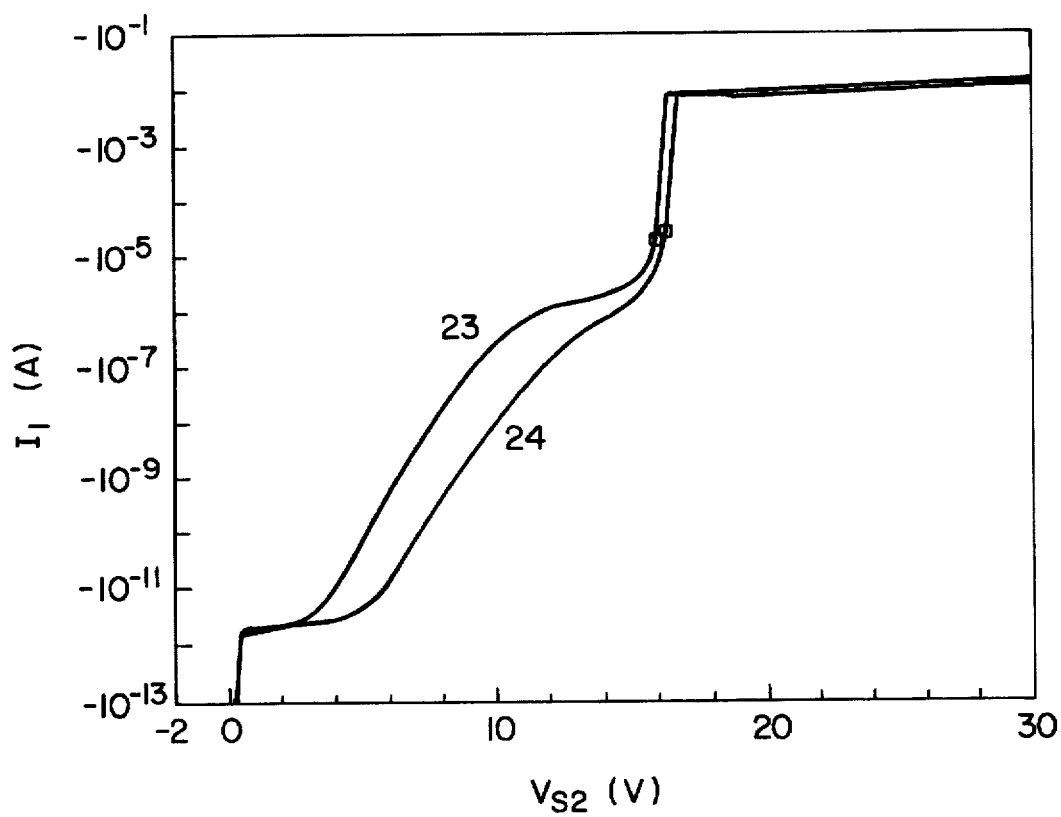
FIG. 6 is a graph showing current-voltage characteristics during writing for a-SI and polySi.
Figure 7:
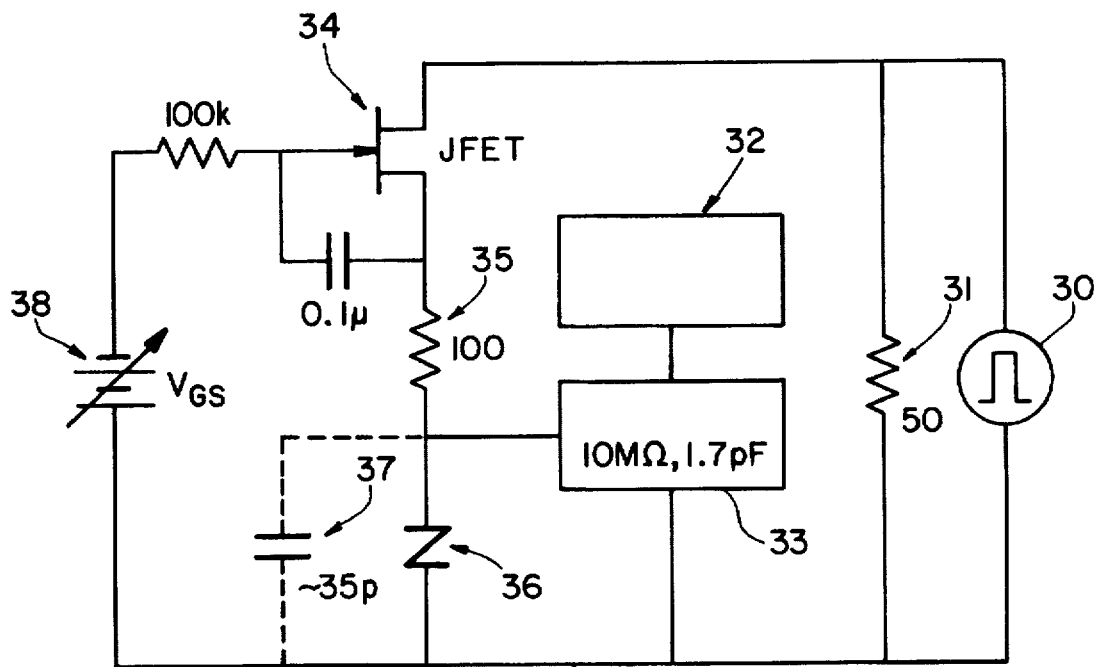
FIG. 7 is a view of a circuit for measuring breakdown phenomena.
Figure 8:
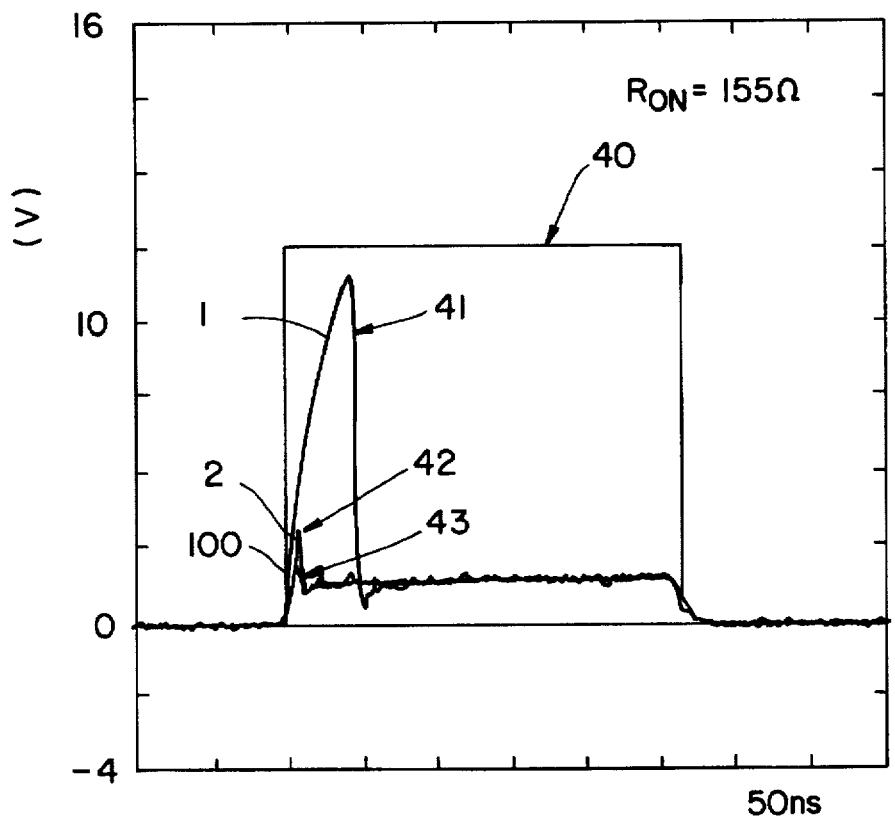
FIG. 8 is a graph showing voltage changes during breaking down.

The first embodiment of the invention is for a device having a structure shown in FIGS. 1 and 2, and by causing a silicide reaction to progress at a speed of 10 m/sec, a silicide region conducted through upper and lower conductors is generated in a selected cell. If the cell in which this silicide region is formed is "1" and a cell having no silicide is "0", binary values can be stored.

The semiconductor device of the invention was formed in the following way. A silicon base plate having a p type layer was prepared, an n$^+$ drain area 6 was formed by a generally known NMOS process, and thereafter a SiO$_2$ film 7 was formed by means of a CVD, an almost square contact hole with one side 1 μm was opened. Then, non-doped hydrogenated amorphous silicon 8 of 100 nm was formed by means of a plasma CVD. The conditions were as follows:

Gas to be used (flow rate) . . . SiH$_4$ (3 sccm), Ar (320 sccm)

Power to be supplied . . . 180 MHz, 150 W

Pressure . . . 10 mTorr

Base plate temperature . . . 300° C.

Then, without being exposed to outside air, the base plate was moved from a CVD chamber to another via a carrying chamber of inert atmosphere. In this chamber, a tungsten film 9 was formed with thickness of 0.5 μm under the following conditions:

Gas to be used (flow rate) . . . H$_2$/Ar/WF$_6$/SiH$_4$ (100:100:10:4)

Pressure ... 120 mTorr
Base plate temperature ... 210° C.
Film forming speed ... 1.2 μm/min.

Then, the base plate was extracted from a multichamber system and an amorphous film and a tungsten film were formed in patterns shown in FIG. 2 by means of photolithography. Then, a film A110 for wiring was formed by means of RF/DC coupling sputtering and patterned. The conditions for Al film formation were as follows:

Gas to be used (flow rate) ... Ar (82 sccm)
Power to be supplied ... 80 W
Pressure ... 3 mTorr
Target bias ... −200V
Base plate bias ... −20V
Base plate temperature ... Room temperature Lastly, a sample was completed by adding a pashvasion film.

The resistance of a cell was measured prior to information writing, and a resistance value was 2 to 3 GΩ when a voltage applied to the amorphous silicon film was 6V. Then, the cell was broken down because of a silicide reaction when 17V was applied with a tungsten side as a positive potential and the ON resistance value of the cell including the MOS transistor was 1 kΩ (an amorphous silicon layer memory element was about 5 Ω).

Then, a sample having almost the same structure as the above-described sample but with the thickness of amorphous silicon (a-Si) changed to 500 Å was made. In this sample, writing was allowed with a writing voltage 9V, writing time 50 nsec. and a writing current 7 mA. Also, a a-Si film was formed by means of a bias sputtering method and a sample was made. The sputtering conditions were as follows:

Gas to be used (flow rate) ... Ar/H$_2$ (200 sccm)
Pressure ... 10 mTorr
Base plate temperature ... 150° C.
Film forming speed ... 250 Å/min.
Power to be supplied ... 100 MHz/100 W
Target bias ... −180V
Base plate bias ... 10V This sample showed the same characteristics as the above-described sample. According to the first embodiment, as described above, resistance can be surely made low by a single writing pulse and the pulse can be made lower than a conventionally needed voltage. A silicide reaction speed was found to be 10 m/sec or higher by the above-described method.

As an example of comparison, a sample was made by forming a tungsten film after the amorphous silicon was formed on the drain area 6 and patterned by means of photolitography. This sample broke down at a silicide reaction speed of 8 m/sec. However, there was big variance in resistance values for cells and the operations of many cells failed. Variance in resistance values of the cells thus broken down and the number of cells broken down by mistake were statistically compared, and it was found that the sample as the example of comparison having a silicide speed within 10 m/sec. showed variance and failures twice as big as that of the embodiment having a speed of 10 m/sec or higher.

(Embodiment 2)

Figure 10:
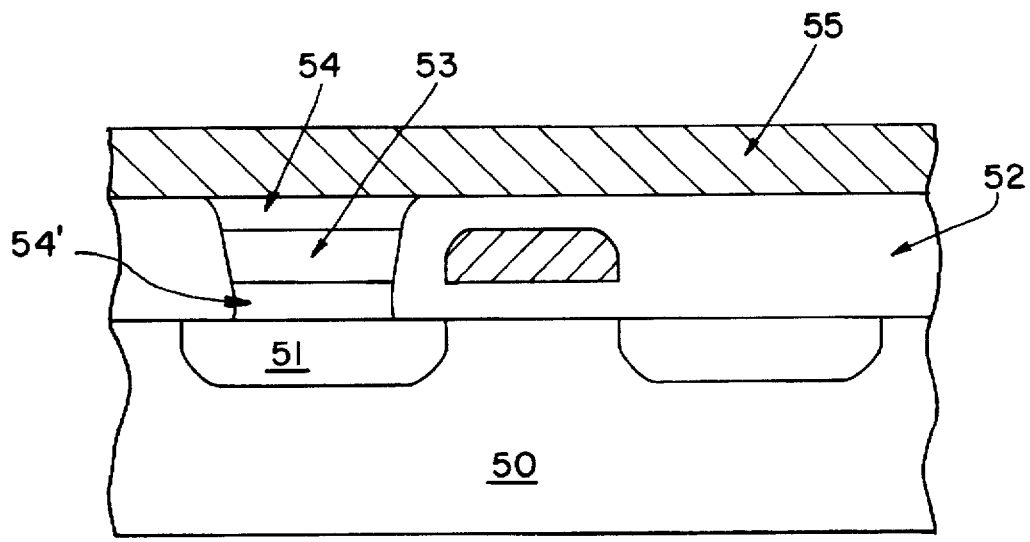
FIG. 10 is an exemplary sectional view showing a cell of a second embodiment.
Figure 9:
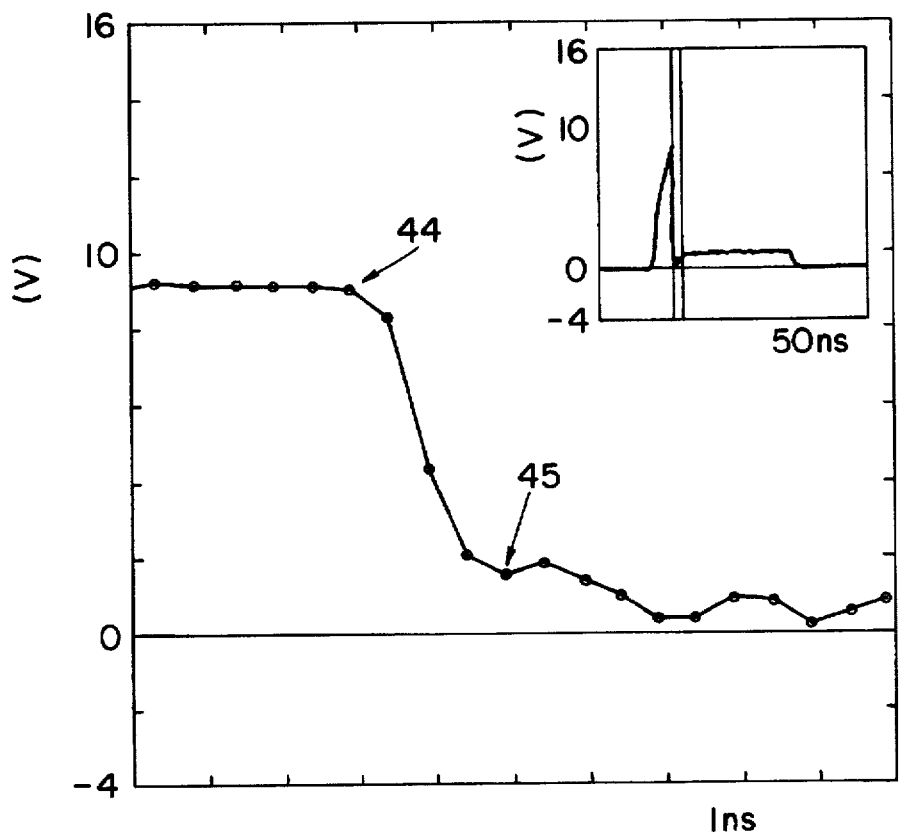
FIG. 9 is a graph showing expanded parts of the drawing in FIG. 8.

FIG. 10 is a sectional view showing the cell structure of a device in the second embodiment of the invention.

The characteristic of the embodiment lies in the fact that a sandwiching structure of metal/amorphous silicon/metal is buried on a substrate conductor in the contact hole, an upper surface thereof is made flat and a wiring is provided. According to the embodiment, it will be possible to provide devices in great quantities and inexpensively by forming a memory element of a size smaller than a minimum processing dimension and achieving high integration of cells and reduction in the number of masks. A sample for the embodiment was made in the following way.

As in the case of the first embodiment, a base plate 50 in which a NMOS transistor was formed was prepared and a contact hole of 0.5 μm was opened. Tungsten (W) films 54' were selected and accumulated only in the contact hole by using WF$_6$ gas, etc. Then, by using gas obtained by diluting SiH$_4$ to 1% with Ar by means of a constant pressure CVD method, an amorphous silicon film 53 was selectively formed in a base plate temperature of 200° C. By selectively depositing W 54 on the amorphous silicon film again, an amorphous silicon memory element having a sandwiching structure was formed in the contact hole. These films were continuously formed without being exposed to air by using the multichamber system. Then, a wiring 55 made of Al—Si—Cu was formed, and a sample was completed by adding a pashvasion film.

According to the embodiment, since metals exist on both of the amorphous silicon films, a writing voltage can be directed in any direction and a freedom for designing a writing driving circuit can be expanded.

Also, a writing speed improved more than the sample of the first embodiment by 10 to 40%. Leakage of a current was reduced more than the sample of the first embodiment by 10 to 40% as well. Wiring capacity was reduced by 10 to 20%.

Furthermore, a sample etched so as to make the contact hole of the above sample tapered, an opening upper part wide and the lower part thereof narrow was made. It was found, then, that yield improved more than the above sample. Characteristics were of the same level.

(Embodiment 3)

FIG. 11 shows a device in the third embodiment of the invention.

The embodiment provides a 2 terminal cell using a diode as a flow rectifying element and is devised to reduce processes and costs and to realize high integration using a process only of wiring film forming and patterning.

Figure 11A:
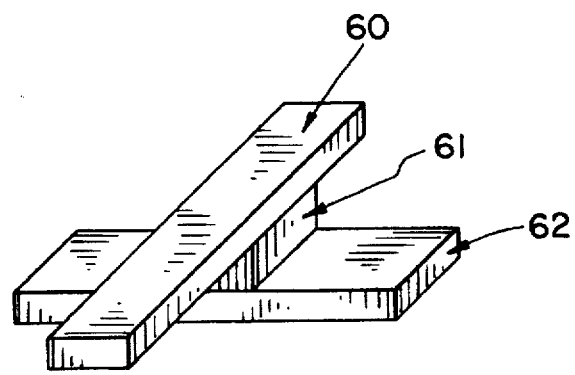
FIG. 11 is an exemplary sectional view showing a semiconductor device of a third embodiment.
Figure 11B:
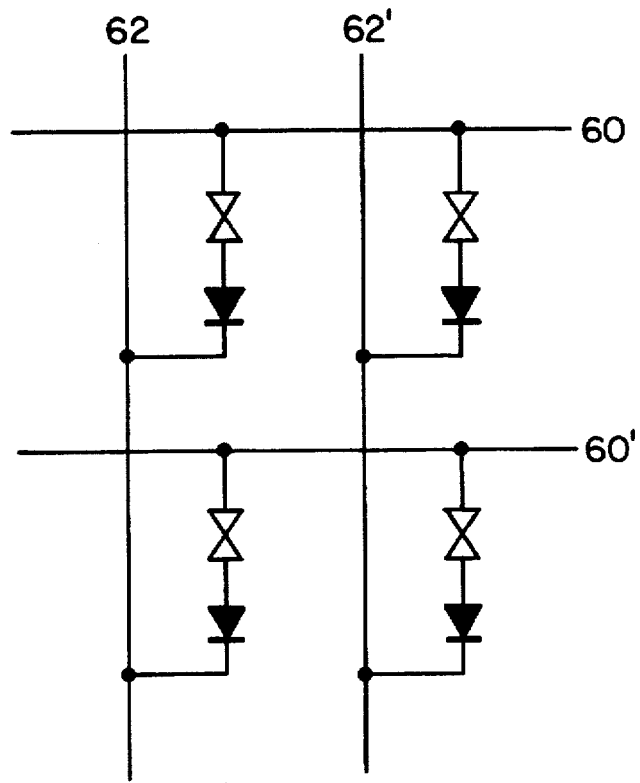
Figure 11C:
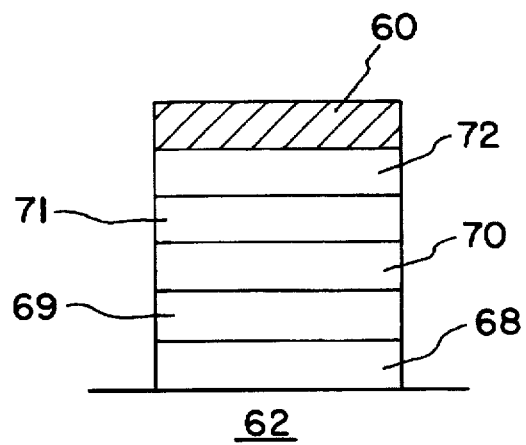

FIG. 11(a) shows a structure thereof, FIG. 11(b) a circuit and FIG. 11(c) a sectional view. 62 and 62' are wirings which are bit lines, 68 a p$^+$ layer, 69 n$^-$ layer and 70 n$^+$ layer, constituting a diode (p$^+$ n$^-$ n$^+$). 71 is a metal layer silicided with amorphous silicon, 72 an amorphous silicon layer and 60 and 60' upper part wirings which are word lines.

A sample for the embodiment was made in the following way.

An electrically conductive film made of Al and Cr for a substrate wiring was formed on a base plate having an insulated surface. Films of p$^+$ type polysilicon, n$^-$ type polysilicon, N$^+$ type polysilicon, Ti and amorphous silicon were continuously formed thereon by means of the multichamber system.

Then, in accordance with a bit line pattern which is a substrate wiring, layers from 62 to 72 were patterned by means of reactive ion etching.

Then, etchings were eliminated from layers 68 to 72 excluding one 62 of laminated patterns remaining in a striped form by using CF$_4$ gas and O$_2$ gas in accordance with the width of an upper part wiring pattern and an island-like laminated body 61 (or 68 to 72) was formed.

Then, in order to form an interlayer insulating film, an almost flat interlayer insulating film was formed by means of etchback using an oxided formed film and a resist.

The a-Si layer 72 was exposed, a natural oxided film was eliminated by using diluted hydrofluoric acid under nitrogen atmosphere, cleansed by superpure water, carried under nitrogen atmosphere, the base plate was moved to a metal formed film chamber and a Cu wiring was formed.

In the embodiment, a structure of laminating Al and Cr as wirings which become bit lines is used. It is needless to say, however, that other metals, alloy materials or low resistance semiconductor materials can be used.

Figure 19:
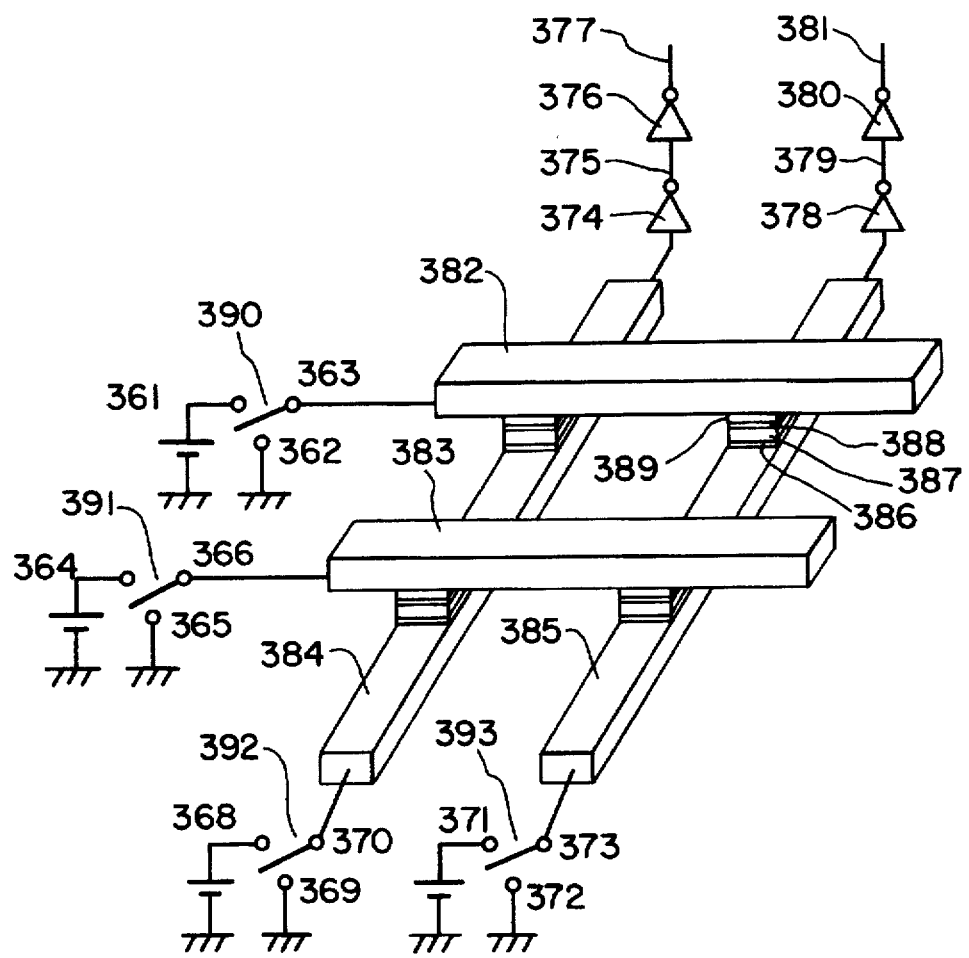
FIG. 19 is an exemplary view showing ROM of a thirteenth embodiment.

Then, a device shown in FIG. 19 was made.

The structure of ROM in FIG. 19 can be formed by complete self-alignment during IC processing. For instance, in FIG. 19, a wiring 385 layer, an $N^+$ layer 386, a P layer 387, an amorphous semiconductor layer 388 and a metal layer 389 are continuously formed, and these are etched together by a wiring pattern of a longitudinal direction. Then, a peripheral part is covered by an insulating film such as a silicon oxided film and the like, the film of the wiring 382 is formed after this part is made flat, and this time etching is carried out up to the very vicinity of lowest wirings 385 and 384 by means of a wiring pattern orthogonally crossing the above wiring pattern. Lastly, by covering it by an insulating film a ROM part shown in FIG. 19 can be formed.

Next, explanation will be made of a modified example of the embodiment by referring to FIG. 12.

In FIGS. 12(a) and 12(b), 201, 203, 207, 211, 213 and 217 are metals while 202 and 212 are P type amorphous silicon having an impurity density of $10^{18}$ $cm^{-3}$ which becomes an antifuse.

204 is P type polycrystal silicon having an impurity density of $10^{20}$ $cm^{-3}$, 205 is $3\times10^{17}$ $cm^{-3}$ P type polycrystal silicon and 206 is $10^{20}$ $cm^{-3}$ N type polycrystal silicon. In FIG. 21(b), on the other hand, PN added to the antifuse is in a direction opposite to that in FIG. 21(a), and 214 is N type polycrystal silicon having an impurity density of $10^{20}$ $cm^{-3}$, 215 is $3\times10^{17}$ $cm^{-3}$ and 216 is $10^{20}$ $cm^{-3}$ P type polycrystal silicon. In a case where an antifuse is made in series with a diode as described above, it is necessary to form a pn diode part of a semiconductor film as similar as possible to a single crystal or a polycrystal in order to reduce leakage of a current. In the case of continuously forming all the films, a polycrystal and amorphous must be separately made within the same device.

Figure 12A:
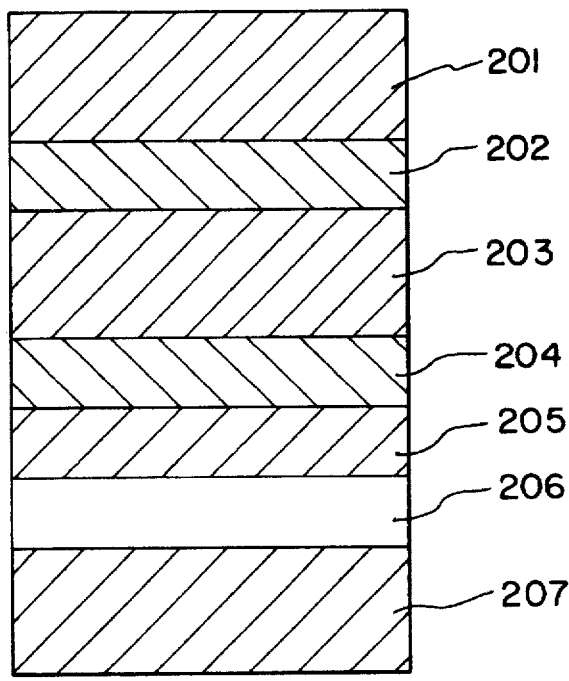
FIG. 12 is an exemplary view showing another example of a structure of the semiconductor device of the invention.
Figure 12B:
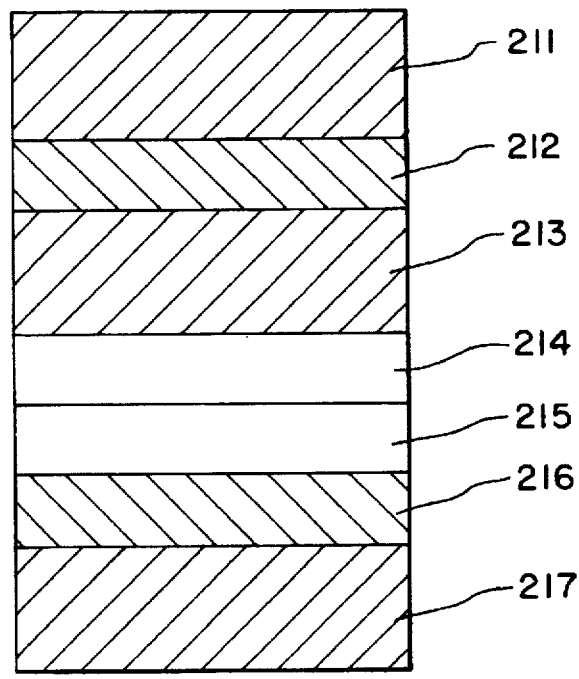

In FIGS. 12(a) and 12(b), amorphous semiconductors 202 and 212 are formed on a polycrystal semiconductor constituting a diode. The amorphous semiconductor can be formed by means of a low temperature CVD or a sputter. For instance in the case of the plasma CVD, conditions for film formation are that $SiH_4$ is 3 sccm and Ar is 320 sccm, a power of 180 MHz and 150 W is applied to an electrode for exciting plasma, plasma of 10 mTorr is excited, a base plate is caused to float and a temperature is set at 300° C. If a P type target having an impurity density of $10^{20}$ $cm^{-3}$ is simultaneously film-formed on the base plate by means of sputtering at this time, an amorphous silicon film doped to a P type having an optional density of $10^{16}$ to $10^{20}$ $cm^{-3}$ by a target bias can be formed.

Conditions for forming a polycrystal silicon film are that $SiH_4$ is 1 sccm, Ar is 320 sccm, a power of 180 MHz and 150 W is applied to an electrode for excting plasma, plasma of 10 mTorr pressure is excited, the base plate is caused to float and a temperature is set at 300° C. In the case of doping it to a P type or a N type, similarly a P or N type target having an impurity density of $10^{20}$ $cm^{-3}$ is simultaneously film-formed on the base plate by means of sputtering, and thereby a polycrystal silicon film doped to an optional density of $10^{16}$ to $10^{20}$ $cm^{-3}$ by a target bias this time can be formed.

Each film thus formed is etched by means of, as described above, RIE by self-alignment.

(Embodiment 4)

In the fourth embodiment, a semiconductor device was made with a diode part as a $N^+pp^+$ type according to a procedure shown in FIG. 13.

The structure of this antifuse is one in which this semiconductor device was formed by self-alignment by means of a technique for selecting and growing a metal on a semiconductor and one for selecting and growing a semiconductor on a metal.

FIG. 13 shows a forming process by means of this self-alignment. A metal layer 220 is film-formed and etched to a predetermined pattern by RIE. This method allows easy film forming by normal sputtering. Then, films of N type polycrystal silicon 221 having an impurity density of $10^{20}$ $cm^{-3}$, P type polycrystal silicon 222 having an impurity density of $3\times10^{17}$ $cm^{-3}$ and P type polycrystal silicon 223 having an impurity density of $10^{20}$ $cm^{-3}$ are formed by means of a plasma CVD method. Conditions for film formation of polycrystal silicon are that $SiH_4$ is 1 sccm, Ar is 329 sccm, a power of 180 MHz and 150 W is applied to an electrode for exciting plasma, plasma of 10 mTorr pressure is excited, a base plate is caused to float and a temperature is set at 300° C. When it is doped to a P type or a N type, similarly a P or N type target having an impurity density of $10^{20}$ $cm^{-3}$ is simultaneously film-formed on the base plate by means of sputtering, and thereby polycrystal doped to an optional density of $10^{16}$ to $10^{20}$ $cm^{-3}$ by a target bias this time can be film-formed (FIG. 13(a)).

Figure 13A:
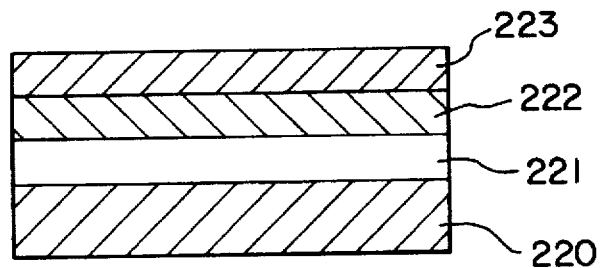
FIG. 13 is an exemplary view showing a method of manufacturing a semiconductor device of a fourth embodiment.
Figure 13B:
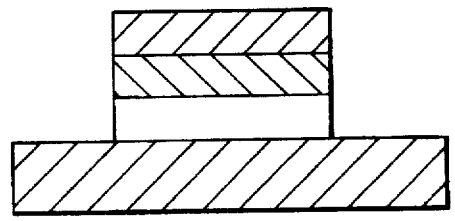
Figure 13C:
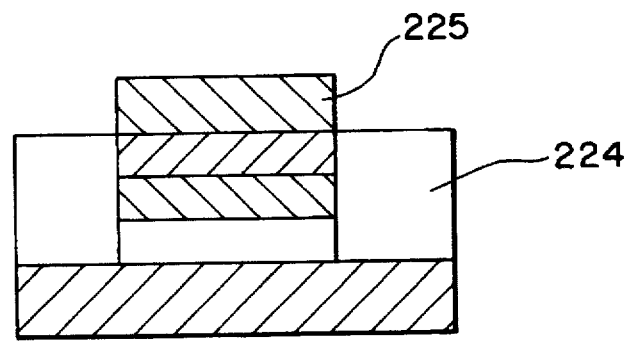
Figure 13D:
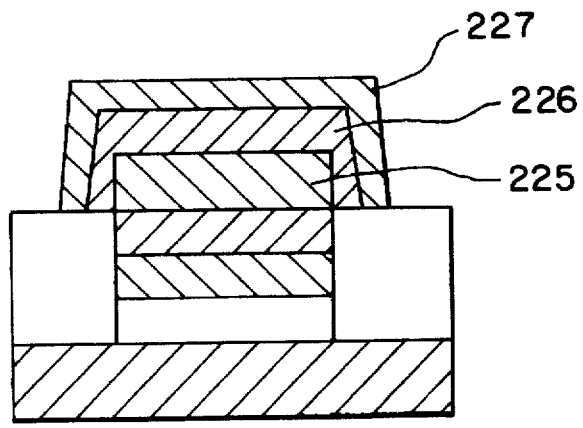

Then, three layers of polycrystal silicon 221, 222 and 223 are etched by RIE (FIG. 13(b)), flattening is performed from deposition of an oxided film 224 to exposure of a semiconductor 223 and a metal layer 225 is selected and grown only on the exposed semiconductor 223 (FIG. 13(c)). Further, a semiconductor layer 226 is formed only on the metal 225 by means of the technique for selecting and growing a semiconductor on a metal. A metal 227 is then formed only on the semiconductor layer 226 by means of the technique for selecting and growing a metal on a semiconductor, and thus a structure shown in FIG. 13(d) is brought about. Selection and growth of the metals 225 and 227 can be performed by the method described in the second embodiment.

(Embodiment 5)

A device in the fifth embodiment of the invention is constructed by a cell having a flow-rectifying element of a Schottky diode and a memory element of an antifuse type. FIG. 14 is an exemplary view illustrating the device of the embodiment. The structure of the device of the embodiment will be explained in terms of a manufacturing process. First, as a base plate 230 having an insulating film surface, W was film-formed, as a metal 231 which is a substrate conductor, on a silicon wafer having $SiO_2$ (FIG. 14(a)).

Then, an insulating film 232 was formed after the W film was patterned and a contact hole was opened. As in the case of the previous embodiment, a P type polysilicon layer 233 and a $P^+$ type polysilicon layer 234 were deposited.

The P layer 233 was polyslicon having a layer thickness of 0.2 μm containing boron of about $3\times10^{17}$ $cm^{-3}$ while the P⁺ layer was polysilicon having a layer thickness of 0.1 μm containing boron of about $1\times10^{20}$ cm$^{-3}$ (FIG. 14 (b)).

Figure 14A:
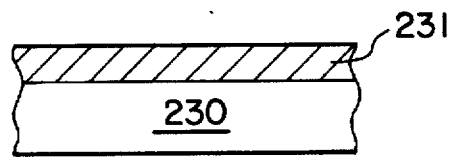
FIG. 14 is an exemplary view showing a semiconductor device of a fifth embodiment.
Figure 14B:
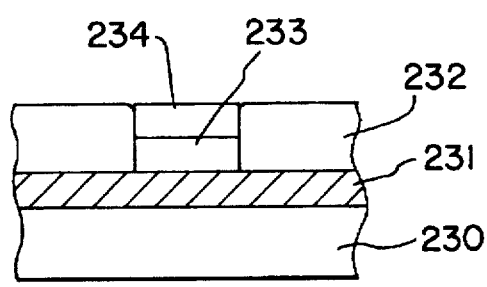
Figure 14D:
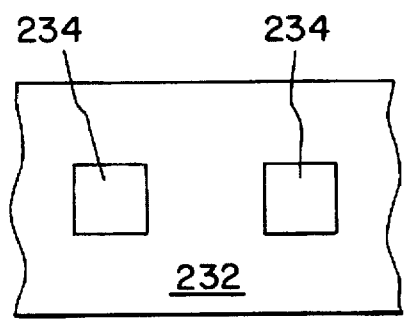
Figure 14C:
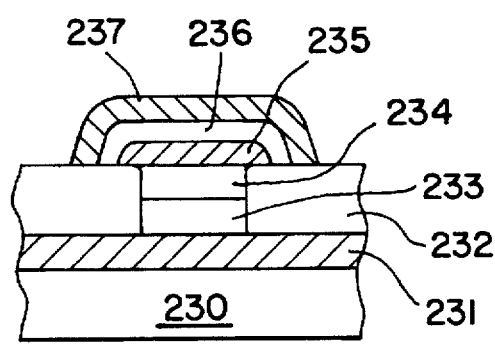
Figure 14E:
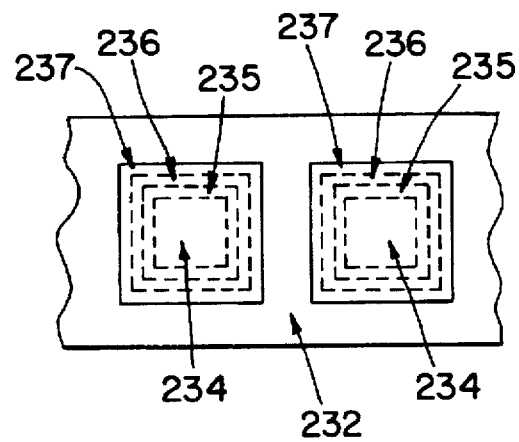

Then, after the W film 235 was selected and grown by 50 nm, a 50 nm a-Si film 236 and a W film 237 were continuously formed and a memory element was made (FIG. 14(c)).

For the a-Si film 236 P type hydrogenated amorphous silicon containing boron of about $1\times10^{18}$ cm$^{-3}$ was used.

In the semiconductor device of the embodiment, since the Schottky diode of the metal and the semiconductor to be slicided was used and switching of dorpant kind was made unnecessary, the layers 233 and 234 were easily formed in the same chamber.

Furthermore, since the selecting and growing techniques were utilized, unwanted contaminants such as oxygen and the like were reduced on the border surface by forming films using the multichamber system and a silicide reaction speed of 10 m/sec or higher was obtained. Thus, the device of the embodiment allows high-speed writing and generates no malfunction. Though no upper layer is shown in FIG. 14, this may be made by forming the W film 237 itself in a wiring-like pattern or another conductive layer may be formed.

(Embodiment 6)

FIG. 15 is a view showing a device of the sixth embodiment of the invention. There is shown a method of short-circuiting between optional ones of a number of wirings. Amorphous semiconductors 255, 256, 257 and 258 are provided being sanwiching between metal wirings 251 and 252 and conductor wirings 253 and 254. These metal wirings 251 and 252 are, for instance tungsten and tantalum, but other metals may be used. The conductor wirings 253 and 254 may be metals or semiconductors having an impurity doped high density.

Figure 15A:
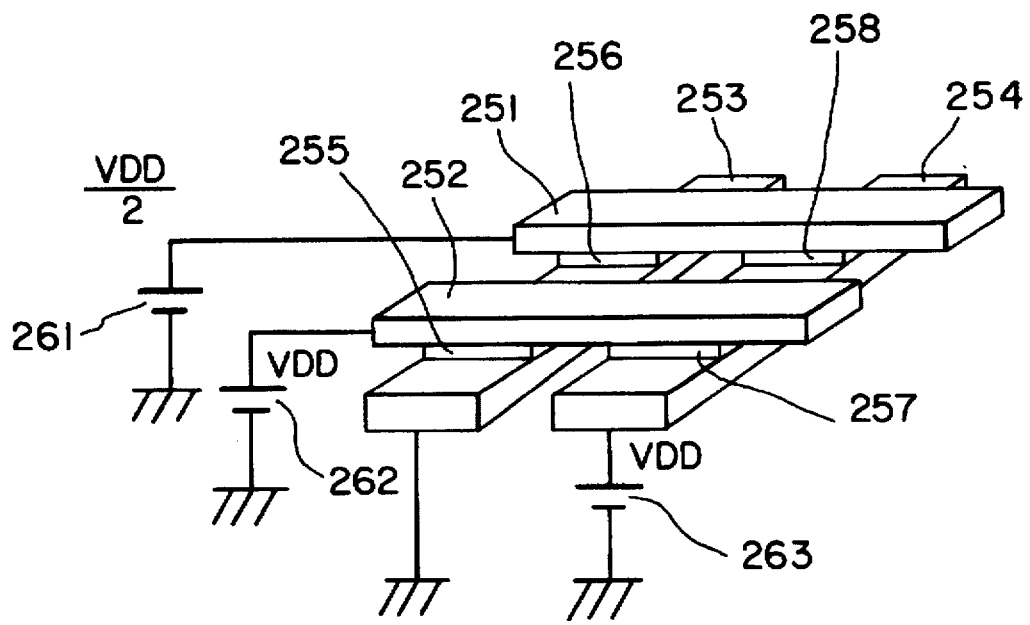
FIG. 15 is an exemplary view and a circuit diagram showing a semiconductor device of a sixth embodiment.

As an example, consideration will be given to turning an artifuse 255 between the wirings 252 and 253 to a conductive state electrically. First, as shown in FIG. 15(a), the metal wiring 251 is connected to a power source 261, the metal wiring 252 to a power source 262, the conductor wiring 253 to a grounding electrode and 254 to a power source 263. At this time, the power source 261 outputs a voltage smaller than the power sources 262 and 263. For instance, if the output of the power source 261 is $V_{DD}/2$ and those of 262 and 263 are $V_{DD}$, a voltage of $V_{DD}$ is applied to the amorphous semiconductor area 255 while a voltage of VDD/2 is applied to those 256 and 258 and no voltage is applied to 257. If the thickness of the amorphous semiconductor layer and the impurity density are preset so as to keep a voltage for causing breakdown in the amorphous semiconductor within $V_{DD}/2$ to $V_{DD}$, breakdown will occur only in the amorphous semiconductor 255. Thus, only the amorphous semiconductor will react with the metal wiring 252 and become a low resistance silicide.

By this method, an amorphous semiconductor area on a optional spot can be changed to a low resistance silicide by changing voltages applied to the metal wirings and the conductive body wirings. This means that connection and insulation of selected wirings can be optionally determined.

Figure 15B:
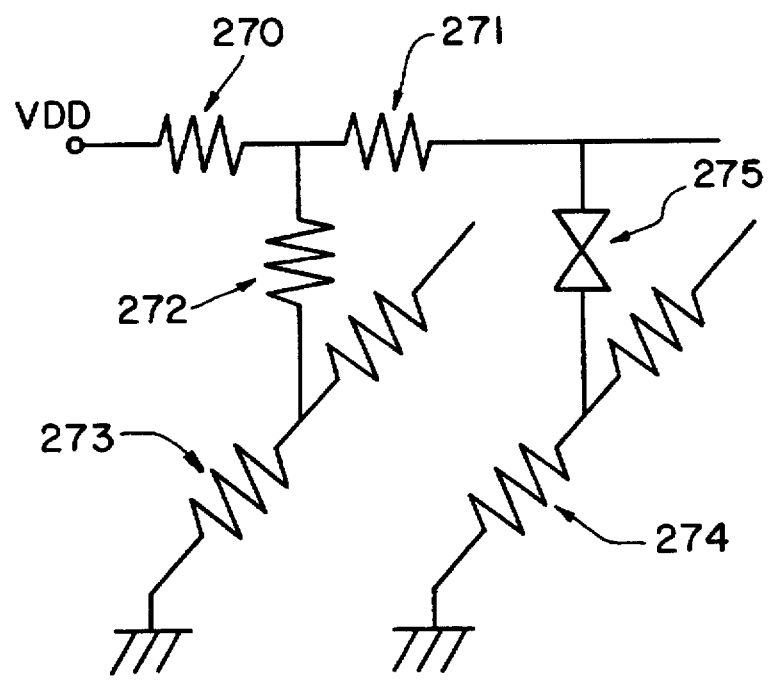

In a case where an atifuse 257 between the wirings 252 and 254 is to be turned to a conductive state electrically, the wiring 254 must be grounded, too. At this time, if the antifuse 255 is already in a conductive state, a current will flow from the wiring 252 through the antifuse 255 to the wiring 253, and thus it is conceivable that voltage reduction will occur on the wiring 252 because of wiring resistance. FIG. 15(b) shows a equalizer circuit used at this time.

Resisters 270, 271, 273 and 274 provide resistance components on the wirings 252, 253 and 254. A resistor 272 is ON resistance of the antifuse 255 and 257 indicates an antifuse 257. For instance, when the wirings 251, 252, 253 and 254 are made of W, if a wiring width is 1 μm and a wiring height is 1 μm, resistance per a wiring length to adjacent antifuse 1 μm is only about 0.055 Ω when antifuses are arrayed at an interval of 1 μm.

On the other hand, since the ON resistance 272 of the antifuse is several ten Ω, there is little voltage reduction on the resistor 270 by a current flowing through the resisters 270, 272 and 273. Thus, since a breakdown voltage is applied only to the antifuse 275, the antifuses can be selectively turned to conductive states.

In this example, a voltage produced by the power source 261 was $V_{DD}/2$. However, other voltages can be produced as long as they are smaller than $V_{DD}$. A voltage applied to the wiring was positive. This is because migration of metal atoms into the semiconductor is brought about and a conductive state of low resistance is easily realized if electrons are caused to flow from the metal side to the amorphous semiconductor at the time of breakdown.

It does not matter whether a positive or a negative voltage is chosen, as long as the materials of the wirings sandwiching the amorphous semiconductor are made of such metals as W, Ta, Ti, Mo and the like on both sides.

Reaction between the metal and the amorphous semiconductor is caused to occur, as shown by this example, by supplying a current to a specified amorphous semiconductor layer. However, it may be possible by giving heat from the outside by a laser or a heater. Reaction can also be produced by supplying a current while giving heat from the outside. Using both, reaction will be made easier and high-speed connection between the wirings will be achieved.

In the embodiment, two metal wirings and two conductor wirings were used. However, the numbers can be arbitrarily arrayed, and also in this case insulation and connection between the metal wirings and the conductor wirings on optional spots can be arbitrarily determined.

In the embodiment, an example of wirings made of metals was shown. However, all the wirings can be made of other than metals, and instead metal layers brought into contact with the amorphous semiconductor layer may be sanwiching between the wirings.

The 2 terminal cell of the embodiment has, as described above, a simple structure. Thus, it can be manufactured at low costs, either polarity can be selected for a voltage to be applied, and since the wiring resistance of the word line is smaller than the ON resistance (a resistance value of a broken down memory element) of the memory element, there will be no voltage decline on the word line.

As described above, connection and insulation between the wirings can be arbitrarily determined by means of a voltage applied between two wirings, and thus in a semiconductor integrated circuit a method of connecting elements can be set after an IC manufacturing process. As a result, for instance by arraying a number of AND circuits and OR circuits, wirings connecting these circuits can be freely determined depending on each user's purpose. In other words, programmable logic array (PLA) can be realized. The preferred embodiments of this invention will be described hereinbelow.

(Embodiment 7)

Figure 16:
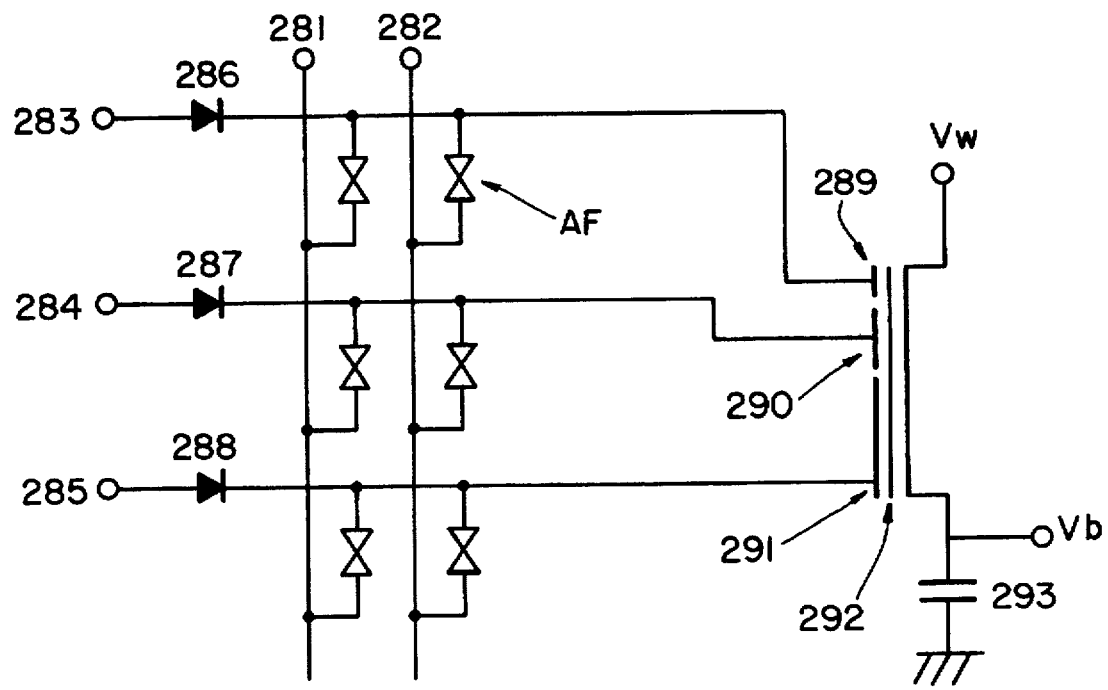
FIG. 16 is a circuit diagram showing a semiconductor device of a seventh embodiment.

The seventh embodiment of the invention is shown in FIGS. 16 and 17.

Figure 17A:
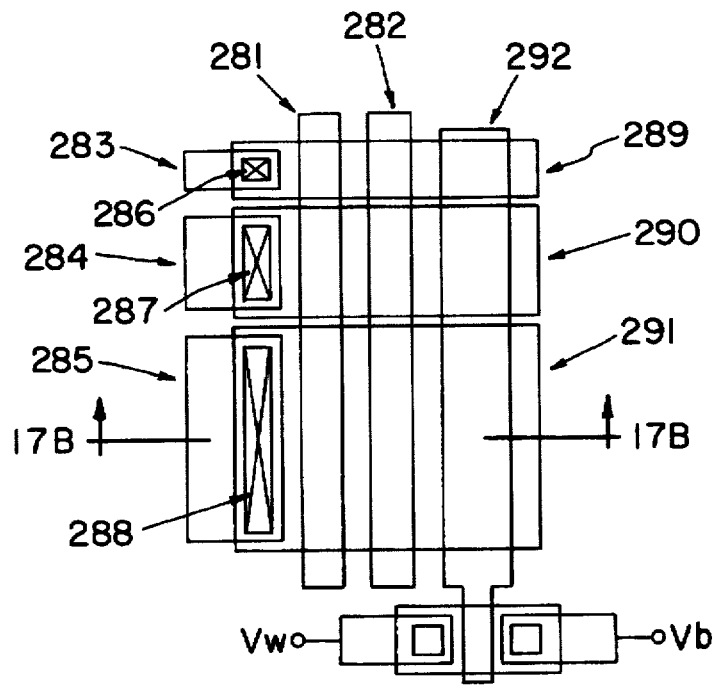
FIG. 17 is exemplary plan and sectional views showing the semiconductor device of the seventh embodiment.
Figure 17B:
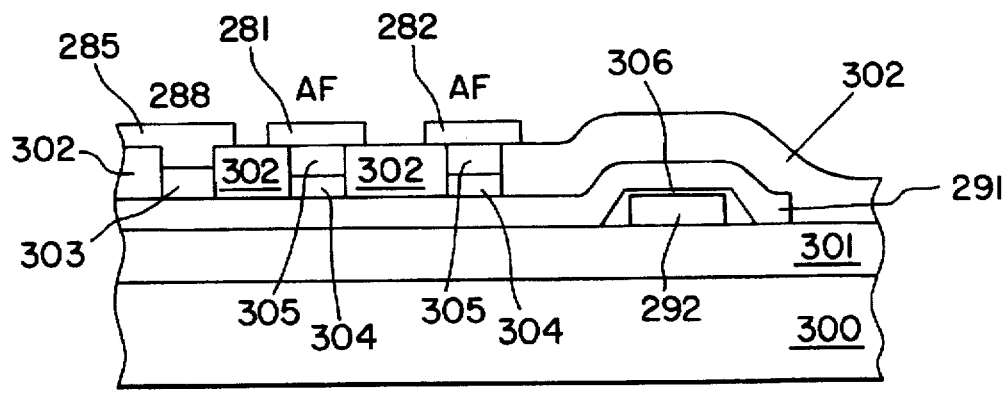

FIG. 16 shows a circuit structure, and FIGS. 17(a) and 17(b) are a plan view and a suctional view of a memory element periphery.

In the embodiment, a memory element of the invention is used on the intersected point of a control gate matrix for determining signals applied to the control gates (289, 290 and 291) of a neuron MOS transistor (vMOS). The bit lines 281 and 282 of the control gate matrix are held at a specified high or low potential during vMOS operation.

Therefore, in order to program voltages applied to the respective control gates (289 to 291), a memory element antifuse (AF) is used. 286 to 288 are diodes.

A writing operation can be performed by the same way as in the case of the above-described embodiment using bit lines 283 to 285.

A voltage applied to the control gate according to the breakdown of the memory element controls a current flowing between the source drains (between $V_W$ and $V_B$) of the vMOS transistor by means of capacity coupling with a floating gate (292).

The potential of the floating gate 292 becomes a linear sum of voltages applied to the control gate, and thus the vMOS can singly treat multivalues.

Next, a structure shown in FIG. 17(b) will be described. 300 is a silicon base plate. 301 is $SiO_2$. 291 is a control gate of $N^+$ type polysilicon, etc., 292 is a floating gate of $N^+$ type polysilicon, etc., 302 is an interlayer insulating film, 304 is a metal to be silicided, 305 is hydrogenated amorphous silicon, 282 is an upper layer wiring as a bit line, 303 is P type polysilicon for forming a PN diode and 285 is a wiring of Al, etc.

According to the invention, by providing a memory element on the control gate matrix of the vMOS, a programmable logic capable of treating multivalues can be made extremely small.

(Embodiment 8)

The eighth embodiment of the invention is a modified example of the semiconductor device shown in FIGS. 1 and 2. The semiconductor layer 8 shown in FIG. 2 is one injected with ions and the pashvasion film on the wiring 10 is one formed at a low temperature of about 250° C. or less. In this case, compared with one not injected with ions, a speed for a silicide reaction improved by about 20%. Thus, it is effective not only for increasing a writing speed but also for reducing a writing voltage, and for higher integration and reduction in power consumption.

A method of making these elements will be described hereinbelow.

A silicon base plate having a P type layer was prepared, an $n^+$ drain area 6 was formed by means of a generally known NMOS process, a $SiO_2$ film was formed by means of CVD, and then an almost square contact hole with one side 1 μm was opened. Then, by means of plasma CVD non-doped d hydrogenated amorphous silicon of 50 nm was formed. Conditions were as follows:

Gas to be used . . . $SiH_4$ (3 SCCM), Ar (320 SCCM)

Plasma condition . . . 180 MHz, 150 W

Pressure . . . 10 mTorr

Base plate temperature . . . 300° C.

Then, it was moved from a CVD chamber to another via a carrier chamber under inert atmosphere without being exposed to outside air. In this chamber, a tungsten film having a thickness of 50 nm was formed under the following conditions:

Gas to be used . . . $H_2/Ar/WF_6/SiH_4$ (flow rate ratio 100:100:10:4)

Pressure . . . 120 mTorr

Base plate temperature . . . 210° C.

Film forming speed . . . 1.2 μm/min.

Then, the base plate was extracted from the multichamber system and the amorphous silicon and tungsten films were patterned in forms shown in FIG. 2 by means of lithography. Metals of Ta, etc., other than W can be used.

After patterning, a first round of ion injection into boron was performed via the metal with an acceleration voltage 25 keV and a dozing amount $5\times10^{12}$ cm$^{-2}$. A second round of ion injection was performed by using Si, Ar, P and As with acceleration voltages 50 to 110 keV and ions were injected into the amorphous layer.

Then, Al for wiring was film-formed by means of RF-DC sputtering and patterned. Conditions for Al film formings were as follows:

Gas to be used . . . Ar (82 SCCM)

Power to be supplied . . . 80 W

Pressure . . . 3 mTorr

Target bias . . . -200V

Base plate bias . . . -20V

Base plate temperature . . . Room temperature

Lastly, a SiN pashvasion film was formed at a temperature of 250° C. or less. It was found that when a temperature exceeds 250° C., silicide reaction may occur and thus pashvasion is preferable. There was no quality deformation found in the layer into which ions were injected by this low temperature film forming and the semiconductor became stable.

In the above-described structure, it is not always necessary to form the semiconductor layer 8 of a-Si. It was found that the same characteristic was obtained by using polySi. This is because it becomes a-Si injected with ions by the above-described means.

(Embodiment 9)

A device in the ninth embodiment is provided with a structure shown in FIG. 12, wherein a-Si layers as first semiconductor areas indicated by 202 and 212 are non-doped layers and 205 and 215 as parts of second semiconductor layers are a P type a-Si layer and a N type a-Si layer. In this case, the film thickness of the non-doped a-Si layers 202 and 212 is 50 nm, that of the P type a-Si layer 205 is 70 nm having a density of $5\times10^{17}$ cm$^{-3}$ and that of the N type a-Si layer 215 is 60 nm having a density of $2\times10^{17}$ cm$^{-3}$. By this structure, resistance between metals 203 and 207 in which a flow-rectifying barrier is formed is lower than that between conductors, that is, metals 201 and 203, and similarly resistance between metals 213 and 217 in which a flow-rectifying barrier is formed is lower than that between metals 211 and 213. Thus, when a writing pulse is applied to the metals 201 and 211, a silicide reaction occurs on the a-Si layers 202 and 212 while no silicide reaction occurs on a-Si layers 204, 205 and 206 on a lower part and those 214, 215 and 216, and no destruction of PN connection was found. This is conceivably due to the fact that by reducing resistance on the lower part a-Si layers no current is caused to flow locally and a current density is reduced.

In the embodiment, though the above-described film thickness and density are used, others can be used as long as resistance of the second semiconductor areas 204, 205 and 206 and that of those 214, 215 and 216 are set lower than that of the a-Si layers of the first semiconductor areas 202 and 212. As a material for a rectifier having a flow-rectifying barrier a-Si is used, the device is constructed by the same materials as 202 and 212 and thus a silicide reaction is generated. However, if resistance on the rectifier side having the flow-rectifying barrier is set small, polySi and a single crystal Si can be used.

In the embodiment, the size of resistance is realized depending on film thickness and density. However, as a means thereof pattern dimension for connection between the metals and the first semiconductor areas, that is, the patterns of the upper parts 201 and 202 can be made smaller than the lower part patterns 203 to 207 and likewise the patterns of the upper parts 211 and 212 can be made smaller than the lower part patterns 213 to 217. Thus, a highly integrated memory can be operated stably and without any failures.

(Embodiment 10)

A semiconductor device of the tenth embodiment having a structure shown in FIG. 12 is one, wherein a-Si layers of the first semiconductor areas 202 and 212 are P type ion injected layers and parts 205 and 215 of the second semiconductor areas are non-doped a-Si layers. In this case, different from the ninth embodiment, resistance between the metals 203 and 207 as conductors, that is, resistance of the second semiconductor layers is set higher than that between the metals 201 and 203 as conductors, that is, resistance of the first semiconductor areas and likewise resistance between the metals 213 and 217, that is, resistance of the second semiconductor areas, is set higher than that between the metals 211 and 213, that is, resistance of the first semiconductor areas. It has been found, however, that after application of a writing pulse a silicide reaction occurs on the a-Si layers of 202 and 212 and the a-Si layers of the second semiconductor areas 204, 205, 206, 214, 215 and 216 are not silicided. This is because the a-Si layers of the first semiconductor areas 202 and 212 are layers injected with ions and thus easily silicided. It has been found, therefore, that it is possible even if resistance on the rectifier side having a flow-rectifying barrier is higher than that of the a-Si layers of the upper part first semiconductor areas 202 and 212.

As a rectifier of the device, a PIN type is used. However, a Schottky type rectifier can also be used. By this structure of the element a stable operation is realized and thus suitable to the highly integrated memory.

(Embodiment 11)

A device in the eleventh embodiment of the invention having a structure shown in FIG. 12 is one, wherein the metals 203 and 213 are made of the second semiconductor areas 204 and 214 and metal materials which generate no silicide reaction. As the metal materials generating no silicide reaction a Al—Si alloy was used, and it was found that even with an impurity density of the second semiconductor areas 204 and 214 set at $5 \times 10^{17}$ cm$^{-3}$ the second semiconductor areas 204, 205 and 206 or 214, 215 or 216 did not form a silicide reacting with the metals 207 and 203 or 217 and 213. A method of using the metal materials not to be silicided in the embodiment is very effective, because it prevents the second semiconductor areas from reacting by mistake as in the case of the method described in the ninth and tenth embodiments. In the embodiment, though all the metals 203, 207, 213 and 217 are made of metals not forming a silicide, it is possible to use these materials for parts thereof. For instance, by forming 203 and 213 of a plurality of electrically conductive materials, only parts thereof brought into contact with the second semiconductor layers can be made of the metals not to be silicided.

By the structure of this element, occurrence of a silicide reaction on unintended parts can be prevented and a highly reliable and highly integrated memory which operates stably can be provided.

Next, explanation will be made on the semiconductor device of the invention and an example of its application by referring to FIGS. 17 to 30.

(Embodiment 12)

FIG. 18 shows the twelfth embodiment of the invention. It is a known fact that all logical functions can be expressed by coupling between AND and OR logics. A circuit in the embodiment is a so-called programmable logic array (PLA) capable of realizing an optional function by preparing AND an OR circuits beforehand and optionally determining connection and insulation between the I/O wirings of these circuits after an IC manufacturing process. In the description of this embodiment, a two input exclusive logical OR (XOR) is taken up as an example in order to simplify explanation.

Figure 18A:
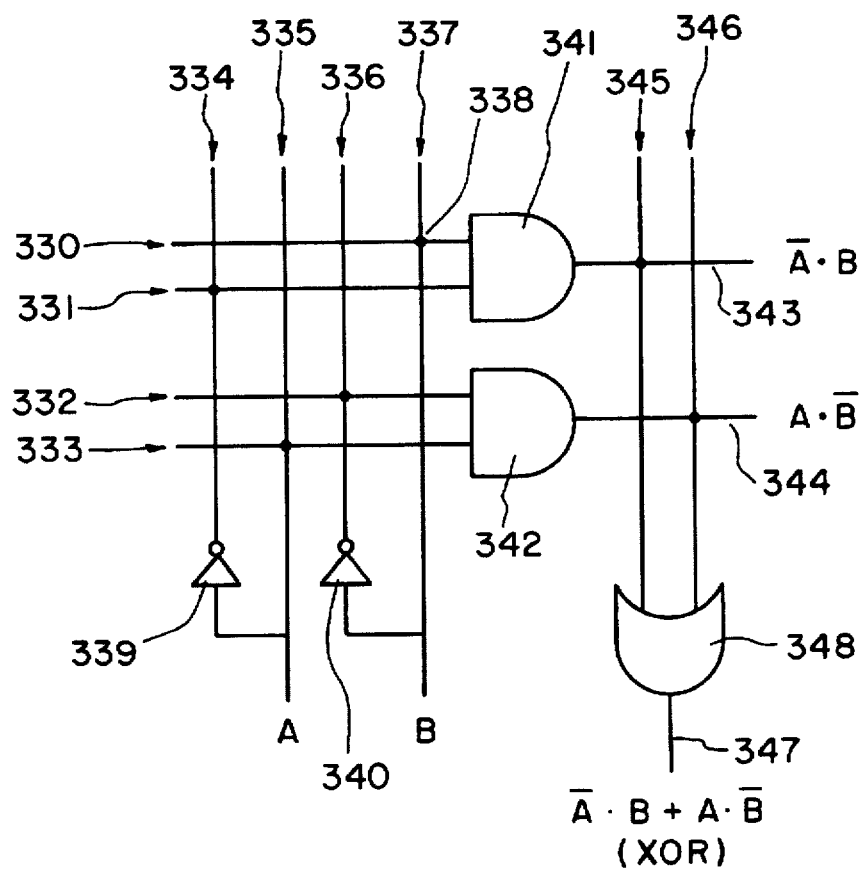
FIG. 18 is an exemplary view and a circuit diagram showing a semiconductor device of twelfth embodiment.

In FIG. 18(a), 341 and 342 are two input AND circuits and 348 is a two input OR circuit. 339 and 340 are inverters. These circuits can be made by means of a normal IC processing technique. 330 to 337 an 343 to 347 are I/O wirings. These wirings may be metals or electrical conductors made of other than these. The wirings 330 to 333 are formed on layers different from those on which the wiring 334 to 337 are formed and the wirings 343 and 344 are formed on layers different from those on which the wrings 345 and 346 are formed.

Figure 18B:
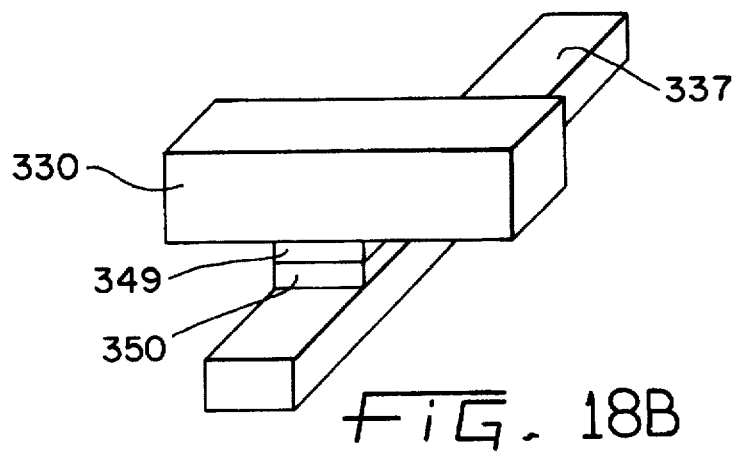

FIG. 18(b) shows the structure of an intersecting portion 338 between the wirings 330 and 337 shown in FIG. 18(a). A layer indicated by 349 is a metal layer and an amorphous semiconductor layer 350 is in contact with this layer. When either one of the wirings 330 or 337 is a metal, it does not matter whether a metal layer 349 is provided or not. Also, a plurality of structures in which the amorphous semiconductor layer and the metal layer are in contact with each other may exist between the wirings 330 and 337.

For example, by applying a voltage between the wirings 330 and 337, bringing about breakdown in the amorphous semiconductor layer 350 and forming a low resistance silicide, the wirings 330 and 337 can be electrically selected and connected. Black dots 338 in FIG. 18(a) indicate that wirings have been selectively connected and these connections can be selectively made in the last stage of an IC manufacturing process or after all processes are finished.

For example, when interwiring connection is performed as in FIG. 18(a), the value of an output 347 is an exclusive logical OR between inputs A and B. Here, interwiring connection is performed in order to realize exclusive logical ORing. It is possible, however, to perform all logical calculations for the two inputs.

Though the two inputs were used in the above, the number of AND and OR circuits can be optionally increased depending on needs and likewise optional logical functions having multiinputs can be realized.

Furthermore, it is needless to say that application of the technique for optionally connecting the wirings is not limited to PLA but this can be applied to a field programmable gate array (FPGA) for optionally connecting wirings among a number of calculating units.

(Embodiment 13)

Figure 20A:
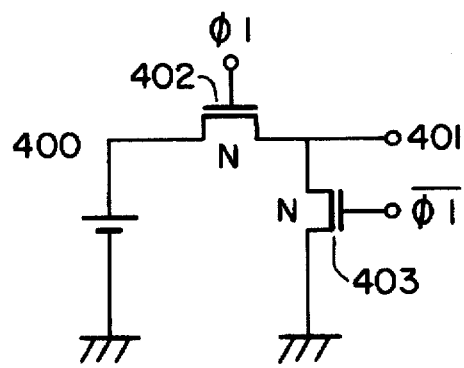
FIG. 20 is a circuit diagram illustrating a switch in FIG. 19.
Figure 20B:
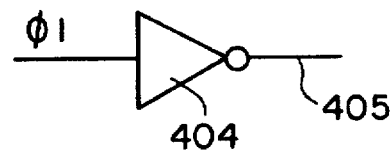

FIG. 19 shows a read-only memory (ROM) of the thirteenth embodiment. Switches 390 and 391 in the drawing can be realized, as shown in FIG. 20(a), by using a NMOS, but these may be constructed, as shown in FIG. 20(b), by CMOS inverters. As for a voltage of a node 401 in FIG. 20(a), a power source voltage appears through a transistor 402 when Φ1 is "1" and a grounding voltage appears through a transistor 403 when Ē1 is "0". In FIG. 20(b), a grounding voltage appears on an output terminal 405 with Φ1 set to "1" and a power source voltage appears thereon with Ē1 set to "0".

Figure 20C:
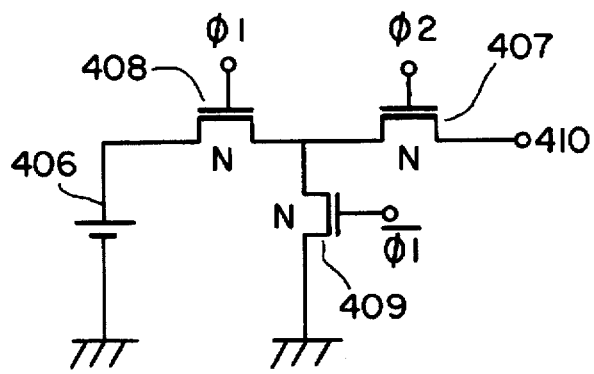

Switches 392 and 393 can set nodes 370 and 373 to three states, one in which these nodes are connected to a power source voltage terminal, one in which these are connected to a grounding terminal and floating one, and these switches can be realized, as shown in FIG. 20(c), by using NMOS.

Figure 20D:
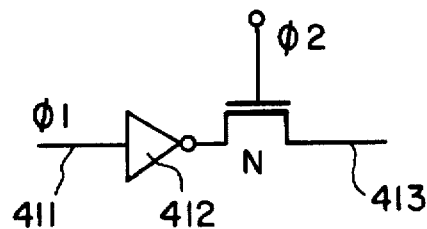

Also, as shown in FIG. 20(d), these may be constructed by CMOS inverters and NMOS. In FIG. 20(c), a transistor 407 is cut off when Φ2 is set to "0" and a node 410 is caused to float. Under the condition that Φ2 is set to "1", a power source voltage appears on the node 410 through the transistors 408 and 407 by setting Ē1 to "1" and a grounding voltage appears thereon through the transistors 409 and 407 by setting Φ1 to "0". In FIG. 20(d), a node 413 is caused to float by setting Φ2 to "0". Under the condition that Φ2 is set to "1", a grounding voltage by setting Φ1 to "1" and a power source voltage by setting Φ1 to "0" appears on the node 413.

Figure 20E:
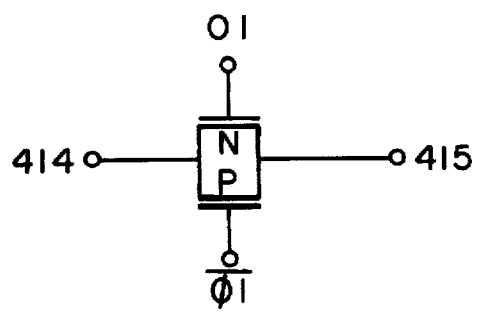

In FIGS. 20(a) and 20(c), NMOSes 402, 403, 408, 409 and 407 may be PMOS or analog switches having CMOS structures shown in FIG. 20(e). In the analog switch having the CMOS structure, the same voltage as on a node 14 appears on a node 415 by setting Ē1 to "1".

Figure 21:
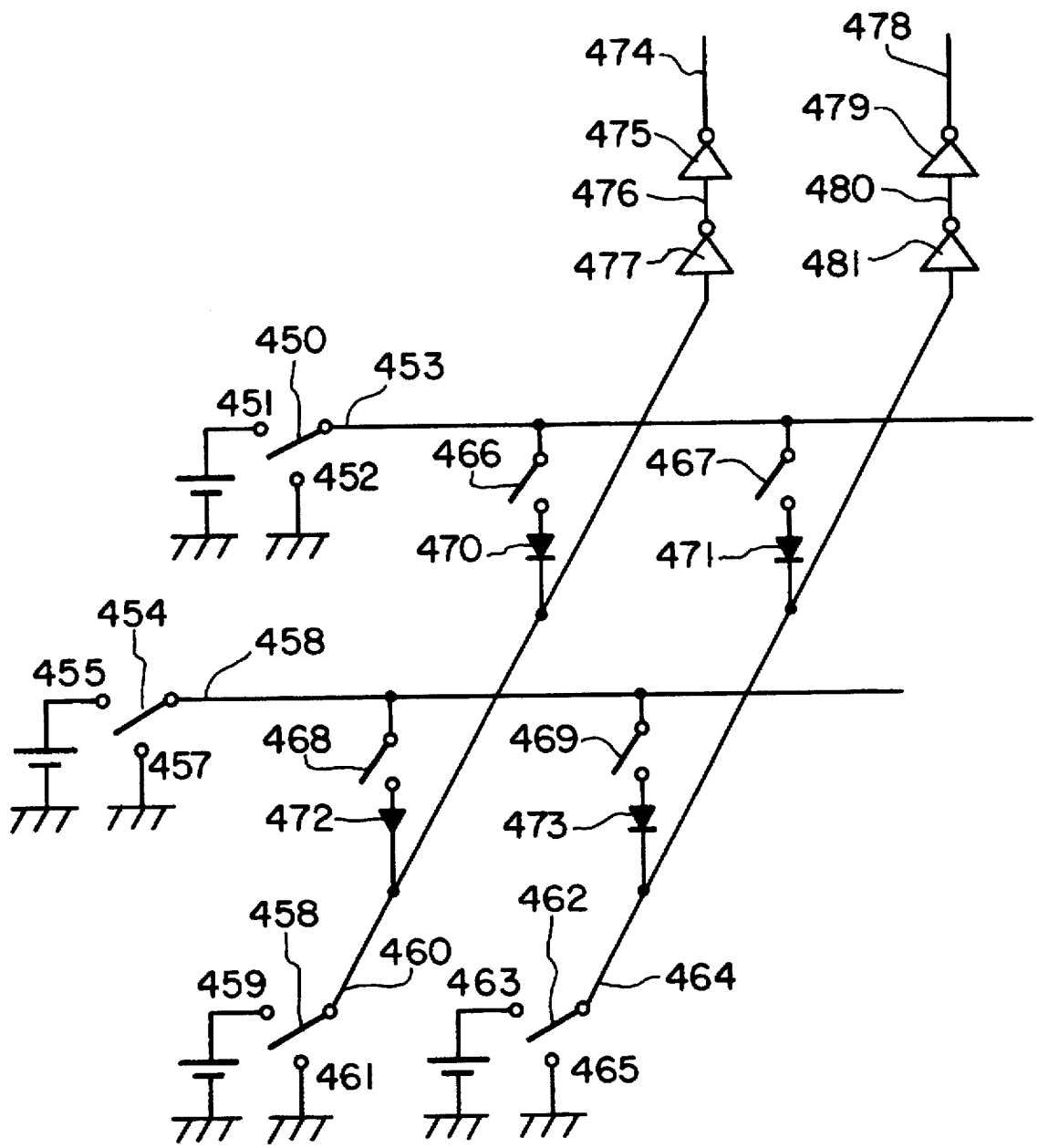
FIG. 21 is a view of an equalizer circuit of the ROM in FIG. 19.

FIG. 21 shows an equalizer circuit of FIG. 19. For the purpose of simplifying explanation, FIG. 19 will be explained by using this equalizer circuit.

First, writing into ROM will be explained. This writing may be performed in the last stage of an IC process (for instance, before packaging) or after all the stages of the IC process are finished. A switch 467 indicates an insulated state of the amorphous semiconductor layer 388 shown in FIG. 19 by means of an equalizer circuit. Similarly, switches 466, 468 and 469 indicate amorphous semiconductor layers and all these switches are in OFF states before writing. A PN diode 471 indicates PN connection between 387 an 386 shown in FIG. 19. The same is true for PN diodes 470 and 473.

453 and 456 are word lines while 460 and 464 are bit lines. Switches 453 and 456 are those shown, for instance in FIG. 20(a) or in FIG. 20(b), and switches 458 and 462 are those shown, for instance in FIG. 20(c) or in FIG. 20(d). 457, 477, 479 and 481 are inverters constituting a sense amplifier for amplifying signals of bit lines and determining "1" or "2" thereof.

Explanation will be made of a method of selectively causing the amorphous semiconductor indicated by the switch 468 to be a low resistance silicide and equivalently switching this ON. It is needless to say, in actuality, that the amorphous semiconductor other than that of the switch 468 can be optionally selected to be a low resistance silicide. Also, irrespective of optional increases in the numbers of word and bit lines, the amorphous semiconductor on an optional spot can be selected to be a low resistance silicide by the same method.

First, by setting all the switches to the grounding electrode side all the word and bit lines are grounded.

Then, by connecting the switch 462 to the power source side the potential of the bit line 464 is set to a power source voltage $V_{DD}$. Though the voltage $V_{DD}$ is applied between the word lines 456 and 453 and the bit line 464 at this time, the direction of this voltage is a reverse bias for PN connections 471 and 473. If resistance at the time of a reverse bias for the PN connections is set sufficiently larger than that of the amorphous semiconductor layer, most of voltages applied between the word lines 456 and 453 and the bit line 464 are applied to the PN connections. Thus, no breakdown occurs in the amorphous semiconductor areas indicated by the switches 467 and 469 and resistance on the layers thereof is always kept high.

Since no voltages are applied between the word lines 456 and 453 and the bit line 460 at this point of time, no breakdown occurs in the amorphous semiconductor areas indicated by the switches 466 and 468 and resistance on the layers thereof is always kept high.

Then, when the switch 454 is set to 455 side and the potential of the word line 456 is increased to $V_{DD}$, the $V_{DD}$ is applied between the word line 456 and the bit line 460 and a potential difference between the word line 456 an the bit line 464 disappears.

Since no voltages are applied between the word line 456 and the bit line 464 at this time, no breakdown occurs in the amorphous semiconductor area indicated by the switch 469 and resistance on the layer thereof is always kept high.

However, since $V_{DD}$ is applied between the word line 456 and the direction thereof is forward for the PN connection 472, resistance thereon at this time is sufficiently lower compared with that in the amorphous semiconductor area indicated by the switch 468 and most of the $V_{DD}$ is applied to the amorphous semiconductor area indicated by the switch 468. Therefore, breakdown occurs in the amorphous semiconductor area indicated by the switch 468, a low resistance silicide is generated and the switch 468 is equivalently switched ON. As a result, "1" has been written in a memory cell on an intersecting portion between the word line 456 and the bit line 460.

To summarize a series of these operations, "1" can be written in a memory cell in an optional place by repeating the following three operations:

1) The potentials of all thee word and bit lines are grounded;
2) By keeping the potential of the bit line to which a memory cell into which writing is to be performed is connected, the potentials of the other bit lines are set to VDD; and
3) The potential of the word line to which a memory cell into which writing is to be performed is set to $V_{DD}$.

It is also possible to simultaneously perform writing into a plurality of memory cells connected to one word line. By selecting one word line without failure, simultaneous writing can be performed into up to all those optionally selected from all the memory cells connected to the same address line.

By allowing simultaneous writing into a plurality of memory cells, a time for writing can be shortened. A method like this is effective for writing a great deal of data such as moving pictures. However, in the circuit shown in FIG. 21, simultaneous writing into the switches 468 and 469 is difficult. This is bacchus, for instance, when writing into the switch 468 is only slightly faster than that into the switch 469, the word line is connected to the ground by means of the switch 469 a voltage necessary for writing is no longer applied to the switch 469.

Figure 30:
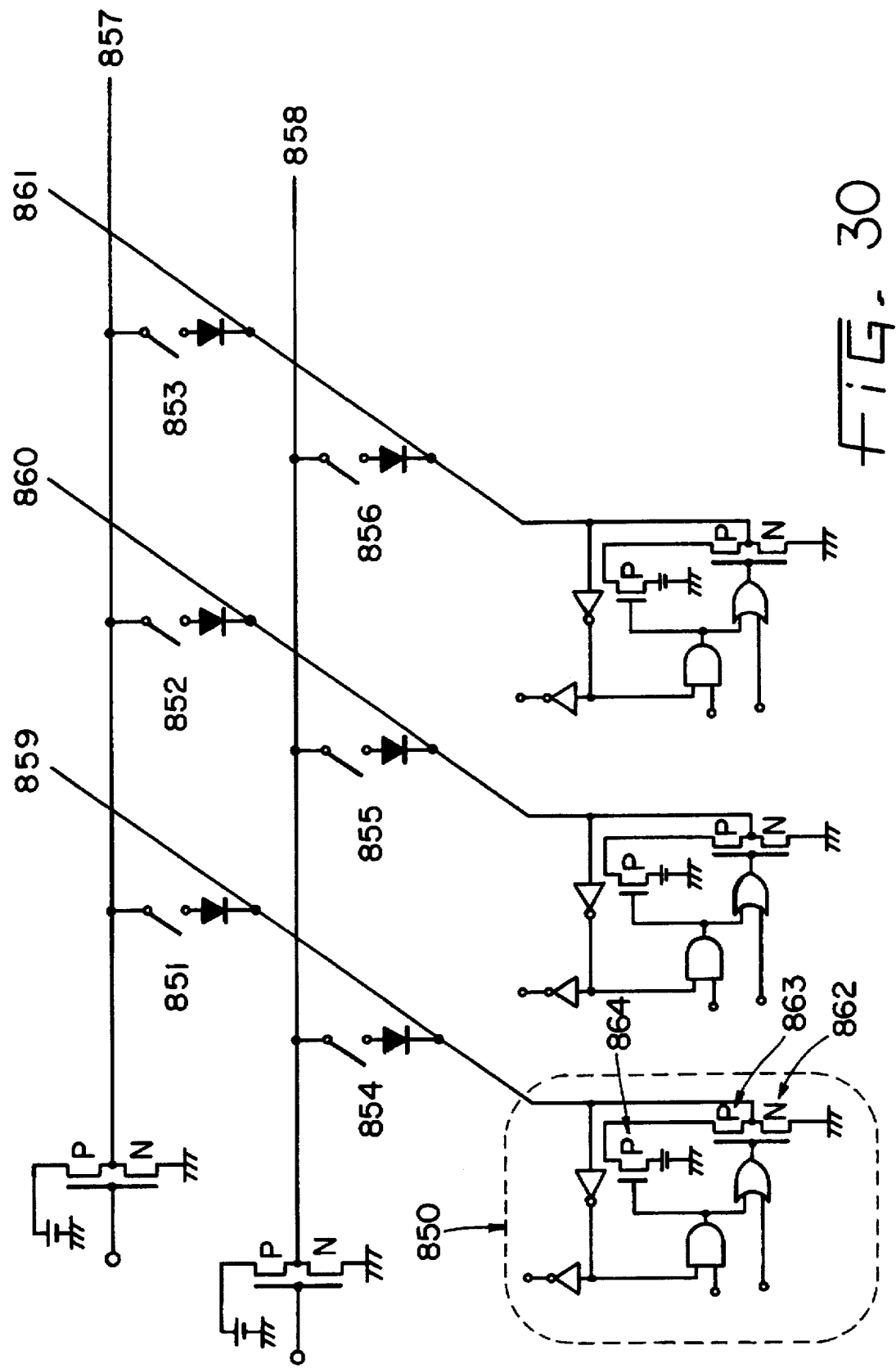
FIG. 30 is a circuit diagram of a semiconductor device having a means for the time of writing completion and a means for finishing writing.

A structure which allows simultaneous writing by solving this problem is shown in FIG. 30.

FIG. 30 shows a memory circuit to which a detecting circuit for detecting completion of writing by a current flowing to each bit line is added. This circuit monitors the potentials of bit lines 859 to 861 during writing. The instance a writing operation is started, the potential of the word line 858 and those of the bit lines 859 to 861 connected to the memory cell into which writing is performed are $V_{DD}$ and grounding potentials respectively. When the memory cell 854 becomes a low resistance silicide after writing is started, a large current is caused to flow, the potential of the bit line 859 increases and exceeds Von (threshold values of the inverters 863 and 862). The detecting circuit 850 switches the NMOS 862 OFF after detecting this, switches the PMOS 864 and 863 ON and charges the bit line 859 to $V_{DD}$ and then writing into the memory cell 854 is finished.

By this operation, the voltage $V_{DD}$ is applied again to the other memory cells 855 and 856 on the same word line and writing is performed sequentially. It is possible, by providing this circuit for each word line, to simultaneously write into a plurality of memory cells. The antifuse of the invention usually needs two kinds of power sources, a circuit operation voltage and a writing voltage. EEPROM also needs two voltage sources and thus a boosting circuit, etc., are incorporated. For the antifuse of the invention two power sources may be prepared by the same method.

However, in the case of the antifuse of the invention, a high voltage is actually needed only for a short time until breakdown occurs, a circuit can be made simple. In addition, since the antifuse allows writing only once, it is preferable that a circuit whose frequency of use is low is made small in an area size.

Figure 34:
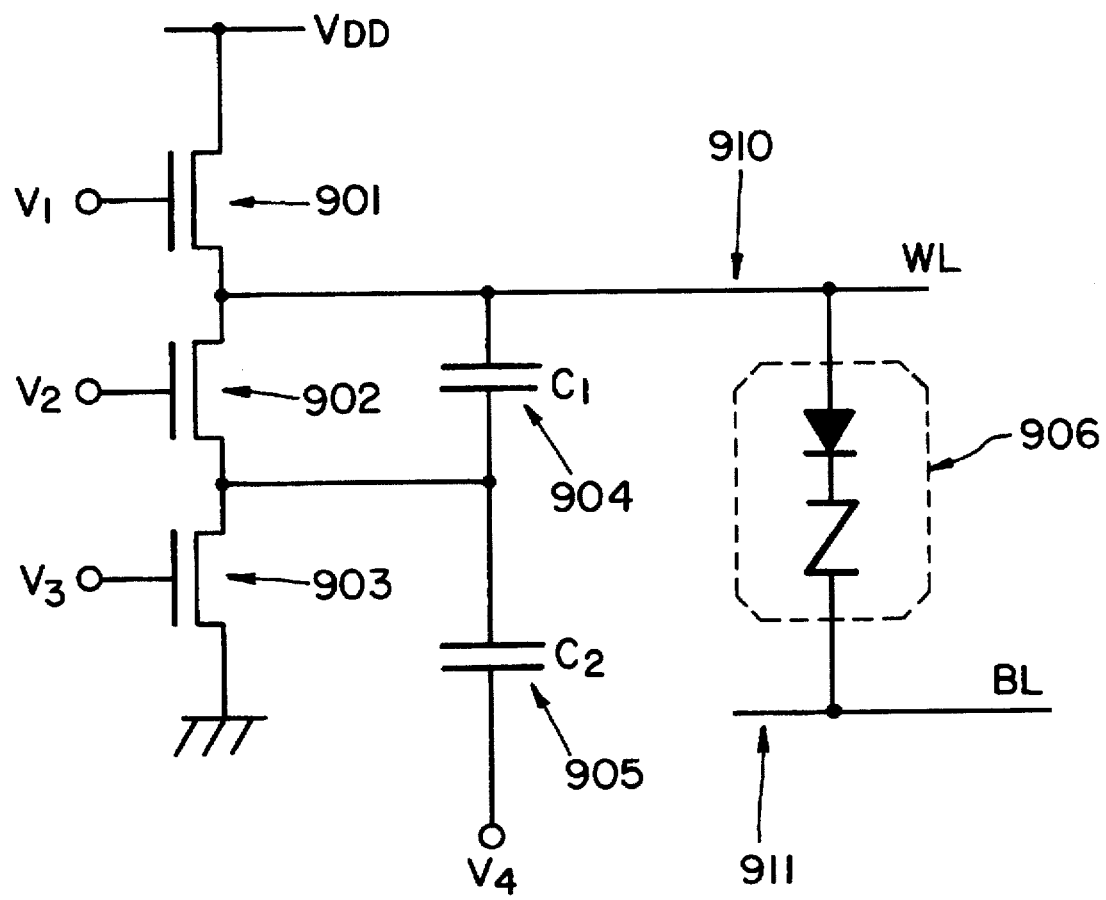
FIG. 34 is a view showing the structure of a single power source power conservation high-speed writing circuit of the thirteenth embodiment.

FIG. 34 shows an example of an antifuse writing circuit capable of high-speed writing using a single power source and consuming low power. The circuit in FIG. 34 is a single power source low power consumption high-speed writing circuit having a circuit for instantaneously increasing a voltage between a bit line 911 and a word line 910 over one causing a breakdown of amorphous silicon by applying a pulse input $V_4$ to the word line 910 via an electrostatic capacitor $C_2(905)$. In the drawing, 901 is a PMOS transistor and 902 and 903 are NMOS transistors.

By using the circuit shown in FIG. 34, antifuse writing can be performed in the following way:

1) Before writing, the potential of the word line 910 corresponding to a memory cell into which writing is performed is fixed to $V_{DD}$ and that of the bit line 911 is fixed to the grounding potential. At this time, $V_{DD}$ is input to $V_3$ and the grounding potential is inputted to $V_1$, $V_2$ and $V_4$. In this way, a capacitor $C_1(904)$ is charged via the transistors 901 an 903;

2) After changing of the capacitor (904) is completed and the potential of the word line increases to $V_{DD}$, $V_3$ is lowered to the grounding potential and $V_1$ is set to $V_{DD}$. At this time, the $V_1$ may be kept fixed to the grounding potential. However, by switching the PMOS transistor as $V_{DD}$, flowing of a through-flow current after writing can be prevented; and 3) Then, a pulse voltage of $V_{DD}$ is inputted to $V_4$. Here, the electrostatic capacitor $C_2$ is designed smaller by 1/5 compared with $C_1$. Thus, when a pulse is inputted to $V_4$, the potential of the word line instantaneously increases to about $2V_{DD}$, a voltage of $2V_{DD}$ is instantaneously applied between the word line 910 and the bit line 911 and thus breakdown of amorphous silicon occurs. At this time, electric charges accumulated in the ccapacitor $C_1$ is caused to flow to the bit line fixed at the grounding potential via the antifuse by the breakdown, a silicide reaction progresses and writing is performed.

In the case of a memory cell into which no writing is to be made, by holding a corresponding bit line at $V_{DD}$ before writing is started, no writing is made even when the above-described writing operation is performed. Also, in a case where $V_4$ is not inputted to the word line corresponding to the memory cell into which no writing is to be made, the potential of the word line may be set to either the grounding potential or $V_{DD}$.

In the circuit shown in FIG. 34, a writing current automatically stops flowing by means of discharging of the electrostatic capacitor $C_1$. Therefore, consumption of power caused by needlessly supplying a current to the antifuse in which low resistance has been obtained is eliminated, making it possible to perform writing consuming less power. Also, by dividing electrostatic capacity between the word line and grounding potentials into two serial capacities, large capacitor $C_1$ and small capacitor $C_2$, equivalent capacity between the word line and grounding potentials is made small. As a result, the quantity of electric charges charged/discharged per writing is reduced and writing with power consumption still more reduced can be performed.

Since a time necessary for increasing the potential of the word line during writing can be made almost equal to a time for changing $C_1$ to $V_{DD}$, a time for charging can be shortened more compared with in a case where the word line is charged to $2V_{DD}$ against the grounding potential.

In the above-described circuit, since application of a writing voltage $2V_{DD}$ to one transistor never happens, it is not necessary to compose a circuit of a device having a specially high breakdown strength. Thus, designing of peripheral circuits can be made easy.

During reading, the large capacitor $C_1$ is short-circuited by setting $V_2$ to $V_{DD}$. Thus, the capacity of the word line potential can be made smaller compared with that of the grounding potential, making it possible to perform reading at a very high speed.

In FIG. 34, the transistor 902 is NMOS. However, PMOS may be used. In this case, for the above-described operation, the grounding potential is inputted instead of $V_{DD}$ and $V_{DD}$ is inputted instead of the grounding potential.

In the case of generating a pulse $V_4$ inputted at the time of writing, an effect of instantaneously increasing potentials via the capacitors can be similarly utilized. This makes it possible to instantaneously increase the potential of $V_4$ higher than $V_{DD}$. Even when a writing voltage is designed larger than $2V_{DD}$, the potential of the word line can be increased to the writing voltage by generating large $V_4$. In the circuit, any method of generating a pulse $V_4$ can be used. $V_4$ has a pulse waveform of a voltage $V_{DD}$. However, waveforms are not limited to this.

In the example in FIG. 34, though the single power source writing circuit is shown as an example of writing by means of generation of a writing voltage via the capacitors, inputs to $V_1$, $V_2$, $V_3$ and $V_4$ need not to have the same voltage amplitude. Also, though the input $V_4$ has an effect of increasing the potential of the word line via the static capacitor, this can be connected to the word line not via $C_1$ but via $C_2$ allowing to obtain the same effect.

Furthermore, by instantaneously increasing the potential of the bit line instead of the voltage of the word line by means of $V_4$, a similar effect can be obtained. This is made possible by connecting the same circuit part as one connected to the word line in FIG. 34 for inputting $V_4$ via $C_2$ to the bit line side. At this time, the input $V_4$ is held at $V_{DD}$ initially, changed to the grounding potential during writing and thus the potential of the bit line can be instantaneously reduced. Moreover, the same method can be used for both word and bit lines.

As described above, by means of the circuit of the invention, a problem of complexity of a normal two power source circuit can be solved, and at the same time high-speed writing can be performed consuming less power.

In ROM having a structure shown in FIG. 19, parts around the wirings 382, 383, 384 and 385, the metal layer 389, the amorphous semiconductor layer 388, the P layer 387 and the $N^+$ layer 386 are covered by insulating films such as silicon oxided films and the like. For instance, a thick oxided film may be formed by means of CVD, etc., after an insulating film is formed of a liquid phase such as superpure water in which ozone is dissolved, hydrogen peroxide water, solution mixing sulfuric acid and hydrogen peroxide water and the like on the border surface. If, for instance, silicon is used for a semiconductor, since a dielectric constant of the silicon is larger by three times than that of a surrounding silicon oxided film in each memory cell part, an electric force line is extended to the silicon side having a larger dielectric constant when an electric field is applied to the amorphous semiconductor layer during writing. Thus, since concentration of the electric field in a corner, a so-called end effect, can be prevented, a breakdown current can be generated not only on the end of the amorphous semiconductor layer but to the full surface thereof, making it possible to form a uniform low resistance metal semiconductor layer on the full surface. This is very advantageous in terms of making element resistance low and attaining a high speed. By switching the metal layer 389 and the amorphous semiconductor layer 388, electrons flow from the metal layer to the amorphous semiconductor layer during writing and metal atoms are pushed out to the amorphous semiconductor layer by the flow of these electrons, making it easy to make resistance low in the amorphous semiconductor area.

When there is a problem of an effect of generated heat in the case of simultaneous writing, writing may be performed while cooling the base plate by liquid or fluids.

Figure 22:
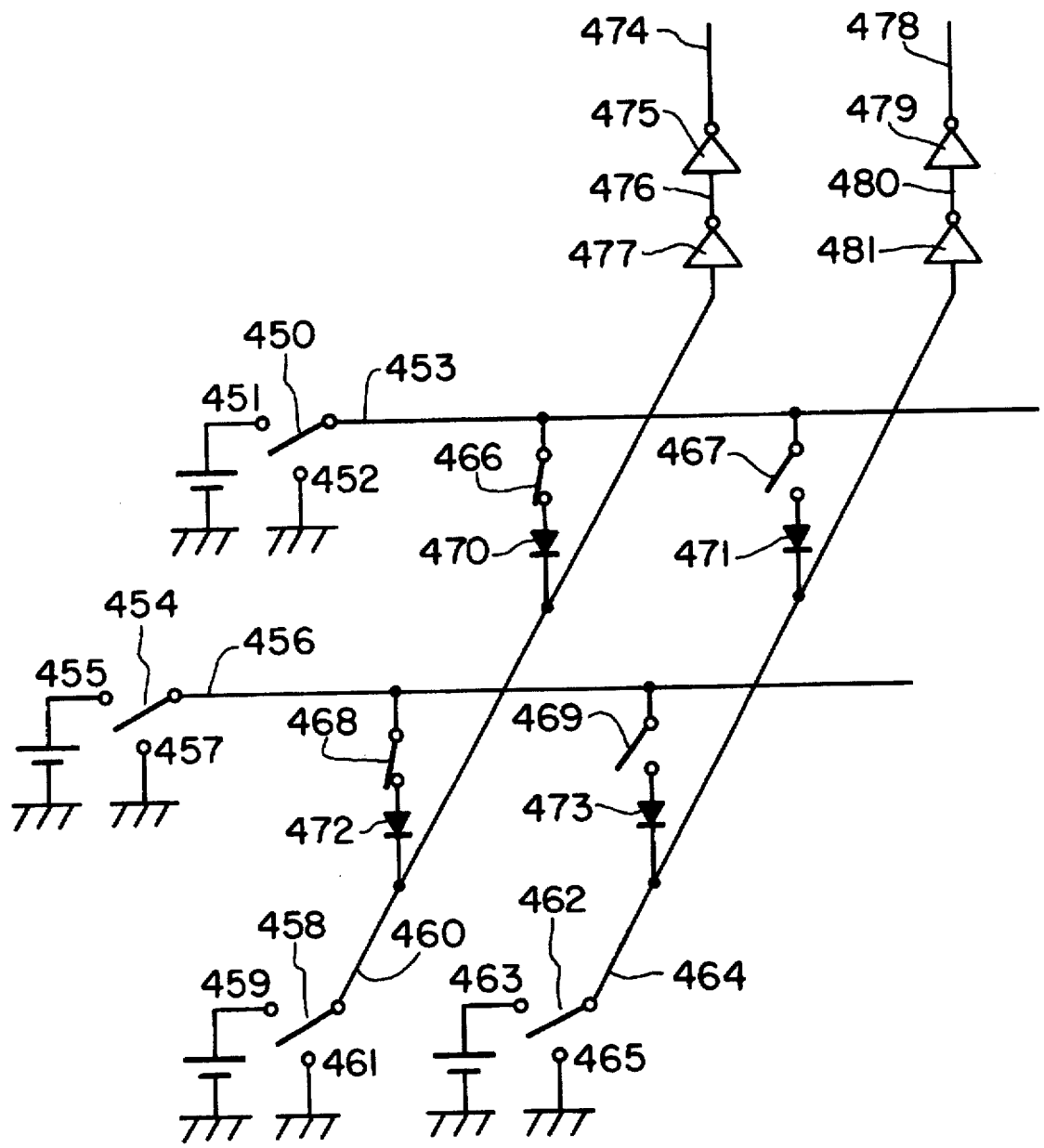
FIG. 22 is a view of an equalizer circuit after ROM writing.

Next, explanation will be made of a method of reading written information. FIG. 22 shows an equalizer circuit wherein only amorphous semiconductor areas indicated by switches 466 and 468 are low resistance silicides (that is, a content of a memory is "1").

Here, for the purpose of simplifying the explanation, a case where only the amorphous semiconductor areas indicated by the switches 466 and 468 are low resistance silicides will be considered. However, it is needless to say that in actuality in memory elements on optional spots amorphous semiconductor areas may be low resistance silicides.

First, the switches 450, 454, 458 and 462 are all set to the grounding electrode side and all the word lines and bit lines are grounded.

Then, the switches 458 and 462 are separated from the ground and the bit lines 460 and 464 are turned to floating states.

Then, the potential of the word line 456 is set to the power source voltage $V_{DD}$ by, for instance, setting the switch 454 to the power source side. Since the switch 468 is in an ON state and the PN connection is biased in a forward direction, a current is caused to flow from the word line 456 to the bit line 460, increasing the potential. If the thresholds of inverters 477 and 481 are set higher than the grounding potential, when the potential of the bit line 460 exceeds the threshold of the inverter 477, the inverter 477 is reversed, followingly an inverter 475 is also reversed and the value of an output node 474 is changed from "0" to "1". By means of this output change, it can be known that the amorphous semiconductor layer indicated by the switch 468 is actually a low resistance silicide. That is, that information stored in the memory cell is "1" can also be read.

A this time, the switch 466 is short-circuited. However, since the potential of the word line 453 is the grounding potential and that of the bit line 460 is positive, the direction of the PN connection 470 is reversed and thus no current is caused to flow from the bit line 460 to the word line 453.

As for the bit line 464, since the switch 469 is OFF, no current flows between the word line 456 and the bit line 464 and thus the potential of the bit line 464 is kept at the grounding potential. Therefore, a output terminal is always kept at "0", and from this it can be known that the amorphous semiconductor layer maintains an insulated state. That is, that information stored in the memory cell is also "0" can be known.

Then, in a case where information stored in the memory indicated by the switches 466 and 467 is to be read, after all the word and bit lines are turned to the grounding potential again, all the bit lines may be floated and the word line 453 may be increased to the power source voltage. The potential of the bit line 460 increases because of a current flowing in through the switch 466 and the forward-direction PN connection. On the other hand, the bit line 464 is kept at "0" because the switch 467 is OFF.

To summarize a series of these operations, information stored in a memory cell in an optional place can by read by the following three steps:

1) All the word and bit lines are turned to the grounding potentials;
2) All the bit lines are placed in floating states; and
3) The potential of the word line connected with memory cell from which reading is to be carried out is turned to "0".

(A content stored in the memory cell can be known by means of an output from a sense amplifier connected to each bit line).

When the bit line increases slightly more than the grounding potential, by latching a result of reading thereof after information of "1" is read, the word line can be separated from the voltage source thereafter. Thus, power consumption can be reduced.

In the embodiment, two word lines and two bit lines are used. However, it is needless to say that the numbers of these may be optionally selected. In this case also, writing into an optional memory cell can be performed and information stored in an optional memory cell can be read.

The characteristic of this ROM is that since information is read through a low resistance silicide and the forward-direction PN connection when the memory element is in a conductive state (information of "1" is stored), reading can be performed at a very high speed. In the case of a conventional ROM, it was difficult to obtain a high speed, because a MOS transistor which is a surface device was used as a switch element and thus a current was small. On the other hand, a current flowing to the forward-direction PN connection increases in an exponential functional manner and a larger current compared with the MOS transistor as the surface device is supplied, making it possible to attain a high speed.

Another major characteristic is that the structure of this ROM can be formed by complete self-alignment during IC processing. For instance, in FIG. 19, the wiring 385, the $N^+$ layer 386, the P layer 387, the amorphous semiconductor layer 388 and the metal layer 389 are continuously formed and these are etched together in the wiring pattern of a longitudinal direction. Then, after peripheral parts thereof are covered by insulating films, for instance silicon oxided films, and made flat, the layer of the wiring 382 is film-formed, and this time etching is carried out up to the vicinity of the lowest wirings 384 and 385 in a wiring pattern orthogonally crossing the above-described wiring pattern. Lastly, by covering these by insulating films again, the ROM part in FIG. 19 can be structured.

By this process the memory cells can be arrayed at the intervals of the wirings end thus high integration is allowed. Since these wiring intervals are determined by minimum processing dimension during IC manufacturing, ROM having an extremely high density can be obtained. If this minimum processing dimension is L, an area occupied by one memory cell is $4L^2$. This is a very high level of integration never attained by the ROM of a conventional type using the MOS transistor for two-dimensionally making an element on a base plate plane.

Also, in this structure, since lamination in a longitudinal direction can be easily carried out during IC processing, a level of integration can be increased more in the same chip area.

Figure 31:
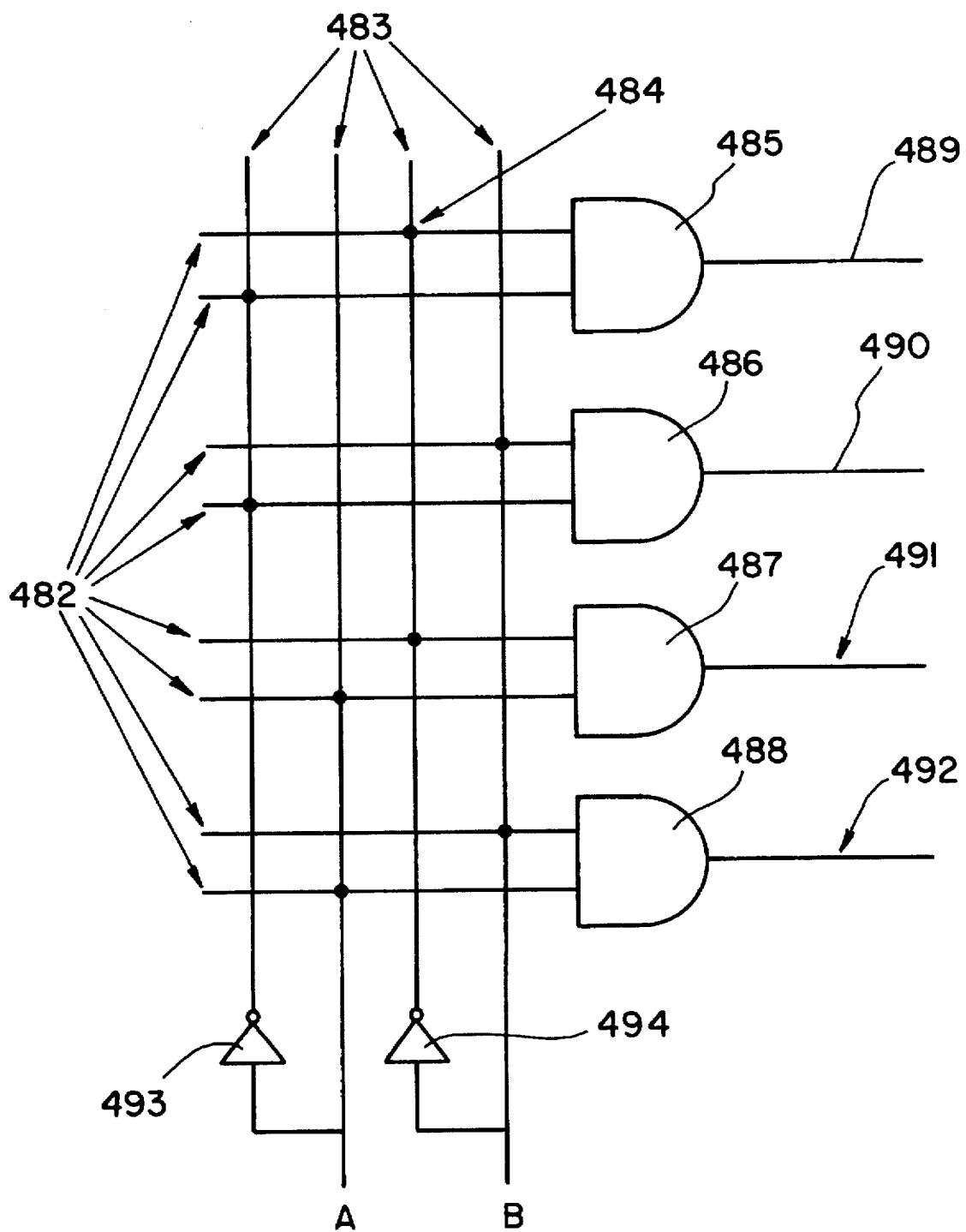
FIG. 31 is a circuit diagram showing an example of a decoder based on the invention.
Figure 32:
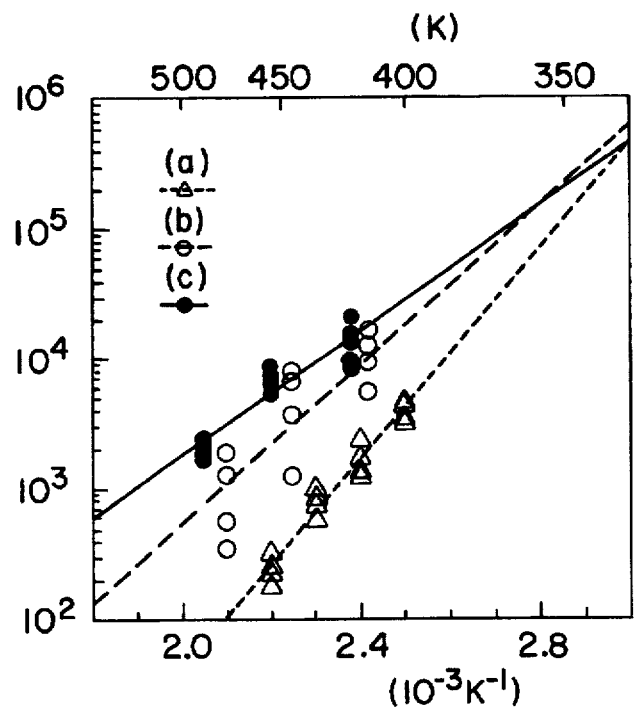
FIG. 32 is a graph showing the reliability of an antifuse after writing.
Figure 33:
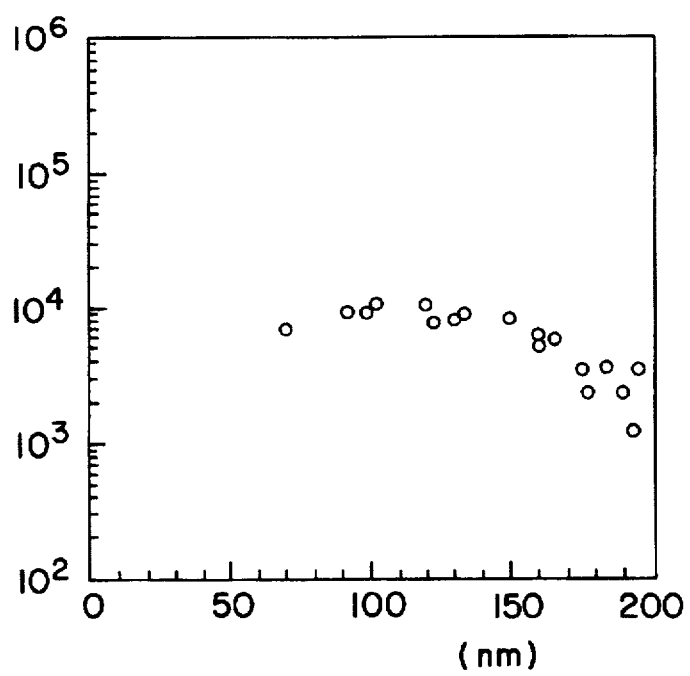
FIG. 33 is a graph showing the failure occurrence rates of the antifuse after writing.

In the embodiment, a method of directly connecting each word line and each bit line to the voltage source or the ground is used. However, when a number of word lines and bit lines exist, the switches 450, 454, 458 and 462 in FIG. 21 may be composed using decoders shown FIG. 31. This is a circuit wherein one is selected from four outputs 489, 490, 491 and 492 and by setting only this output to "1" the other outputs are set to "0".

Black dots 484 indicate that connection between the wirings 482 and 483 is in an electrically short state. A and B are inputs 493 and 494 is an inverter. 485, 486, 487 and 488 are AND circuits and the output 489 of 485 is "1" only when A is "0" and B is "1". The output 490 of 486 is "1" only when A is "0" and B is "1". The output 491 of 487 is "1" only when A is "1" and B is "0". The output 492 of 488 is "1" only when A is "1" and B is "1".

By means of two inputs A an B as described above, one of four output lines can be selected. A floating state can be realized by connecting a NMOS transistor to each output line and setting a signal inputted to a gate thereof to "0".

By increasing the size of the circuit, based on the same principle, optional output lines can be selected from a larger number of output lines.

As described above, the word lines and the bit lines may be selected by means of the decoder. It is needless to say, however, that the same can be performed by using a random logic instead.

Figure 23A:
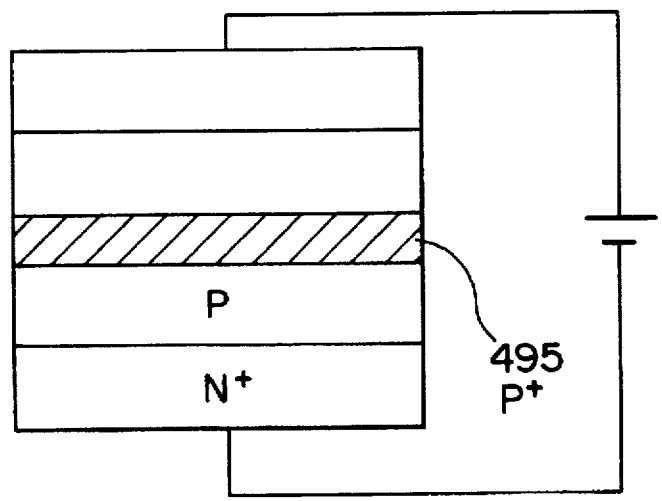
FIG. 23 is an exemplary view showing another example of the semiconductor device of the invention.

The structure of the memory cell shown in FIG. 19 may be made by sandwitching a high-density layer 495 between the amorphous semiconductor and the P layer as shown in FIG. in FIG. 23(a). In this way, after reaction between the metal and the amorphous semiconductor is finished, by means of a contact between the low resistance silicide and the high-density layer contact resistance can be reduced more and a large forward-direction current can be caused to flow.

Figure 23B:
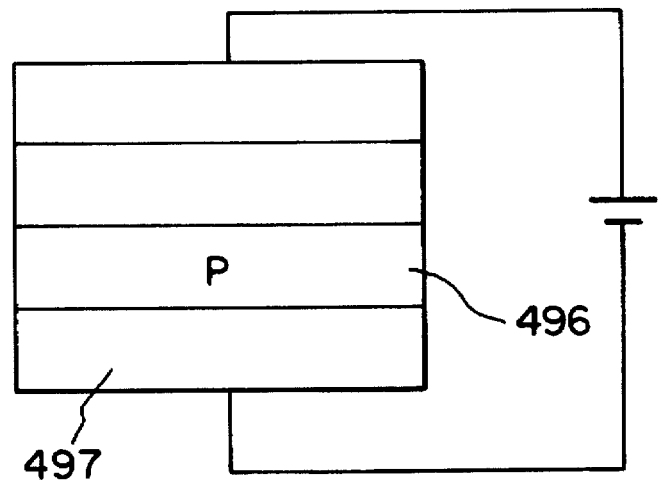

Though in the embodiment the PN connection is used in the ROM, a Schottky connection between a semiconductor 496 and a metal 497 maybe used instead as shown in FIG. 23(b). As in the case of the PN connection, a memory cell can be provided with a flow-rectifying characteristic in this case.

As clear from the above description, the directions of the PN connection and the Schottky connection may be reversed if a power source voltage is changed between positive and negative depending on cases.

(Embodiment 14)

Figure 24:
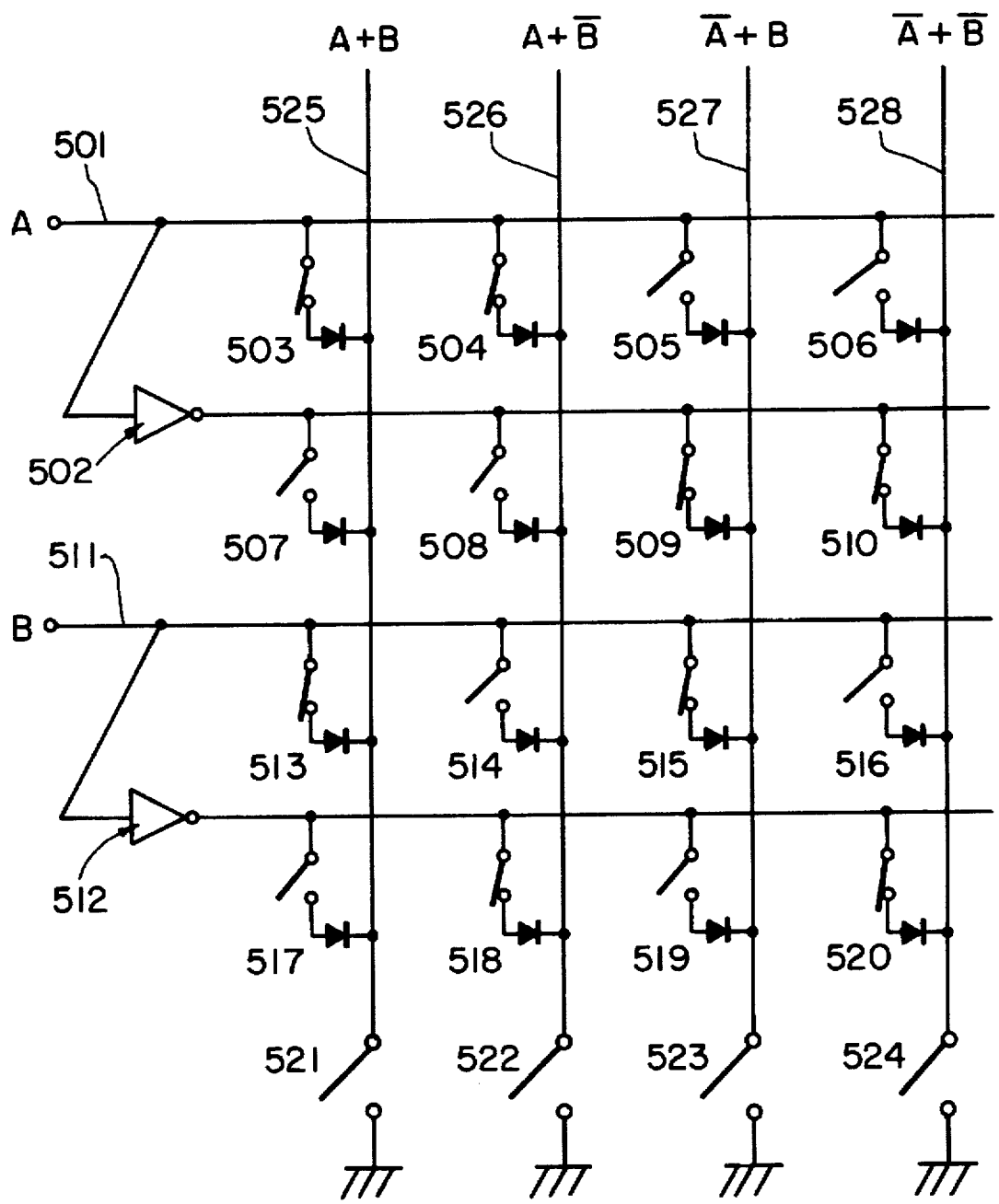
FIG. 24 is a circuit diagram showing a semiconductor device of a fourteenth embodiment.

The fourteenth embodiment of the invention is shown in FIG. 24.

FIG. 24 shows a circuit for outputting logical OR between two inputs. 503 to 510 and 513 to 520 are switches and PN diodes and these indicate amorphous semiconductor layers and PN connections sanwiching between word lines 501 and 511 and bit lines 525, 526 and 528. Here, the switches are ON and this indicates that the amorphous semiconductor layers and metal layers are selectively reacted and these are low resistance silicides.

502 and 512 are inverters. Switches 521 to 524 are for initializing each bit line to a grounding potential, and by switching these switches OFF and causing the bit line to float after initialization a calculation result appears in each bit line.

Since signals A and B are electrically connected to the bit line 525 through the switches 503 and 513, if there is "1" in either one of these, "1" appears in the bit line 525. That is, this means that logical OR between A and B is calculated.

Similarly, logical OR between the reverse of B and A appears in the bit line 526, logical OR between the reverse of A and B in the bit line 527 and logical OR between the reverse of A and the reverse of B in the bit line 528. By gradually increasing the numbers of input lines and output lines by means of this method, logical OR between an optional combination of optional inputs can be calculated.

The total number of combinations of A and B inputs, only one of the four bit lines 525 to 528 is "0" for each and the remaining three are "1". Therefore, by reversing the output of each bit line and outputting it, only one of the four bit lines 5225 to 528 is "1" for each of the combinations of A and B and the remaining three are "3", realizing a decoder shown in FIG. 30.

Figure 25:
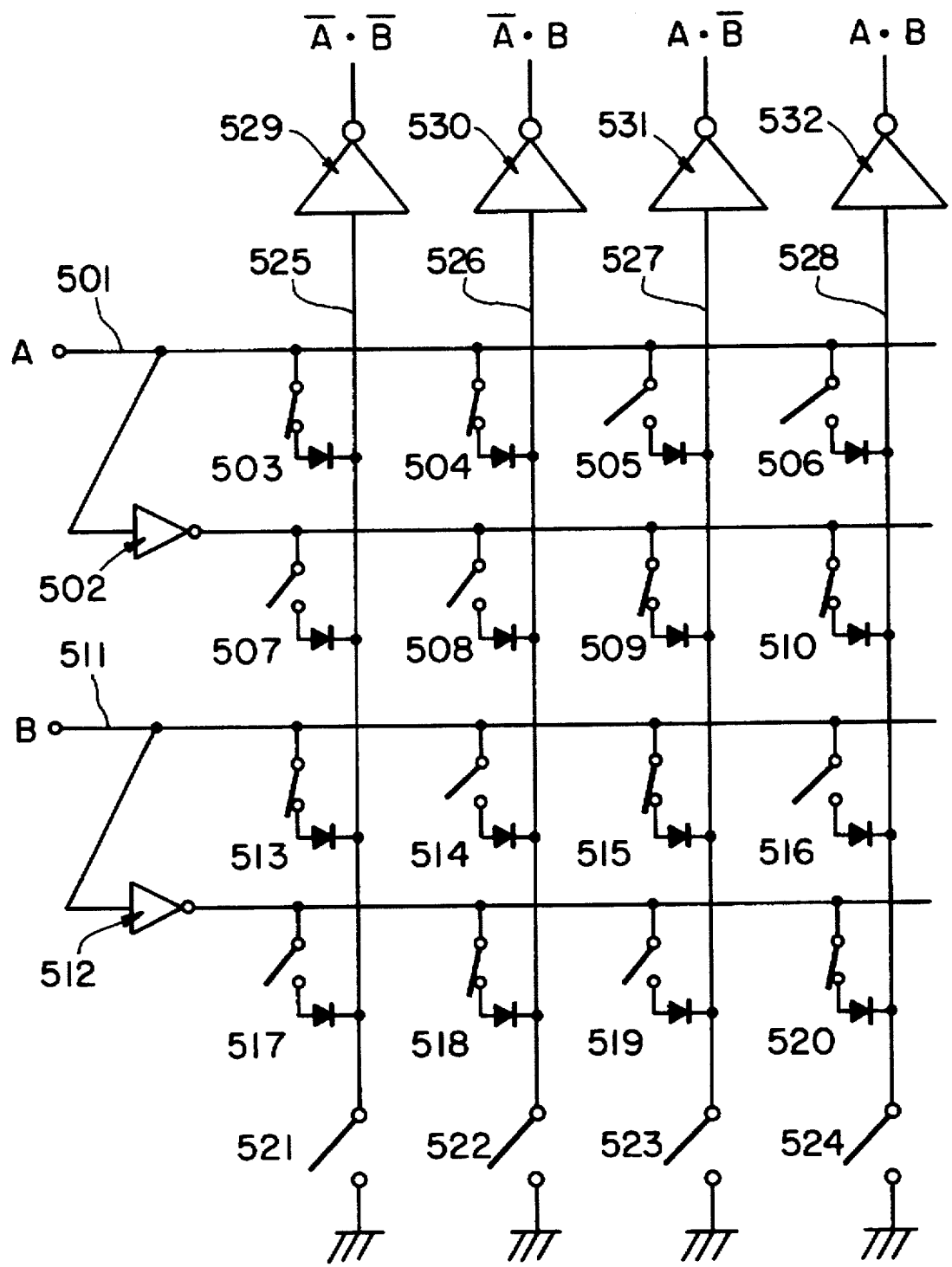
FIG. 25 is a circuit diagram showing the semiconductor device of the fourteenth embodiment.

FIG. 25 shows a circuit for reversing the output of each logical OR in FIG. 24 by means of inverters 529, 530, 531 and 532 and outputting this. An output reversed by the inverter 529 is indicated by logical AND between the reverse of A and the reverse of B. An output reversed by the inverter 530 is indicated by logical AND between the reverse of A and B. An output reversed by the inverter 531 is incidated by logical AND between the reverse of B and A. An output reversed by the inverter 532 is indicated by logical AND between A and B. That is,only one of the four outputs 529 to 532 is "1" for each of the four combinations of A and B and the remaining three are "0", realizing a decoder.

By gradually increasing the numbers of input lines and output lines, logical AND between an optional combination of optional inputs can be calculated.

Figure 26:
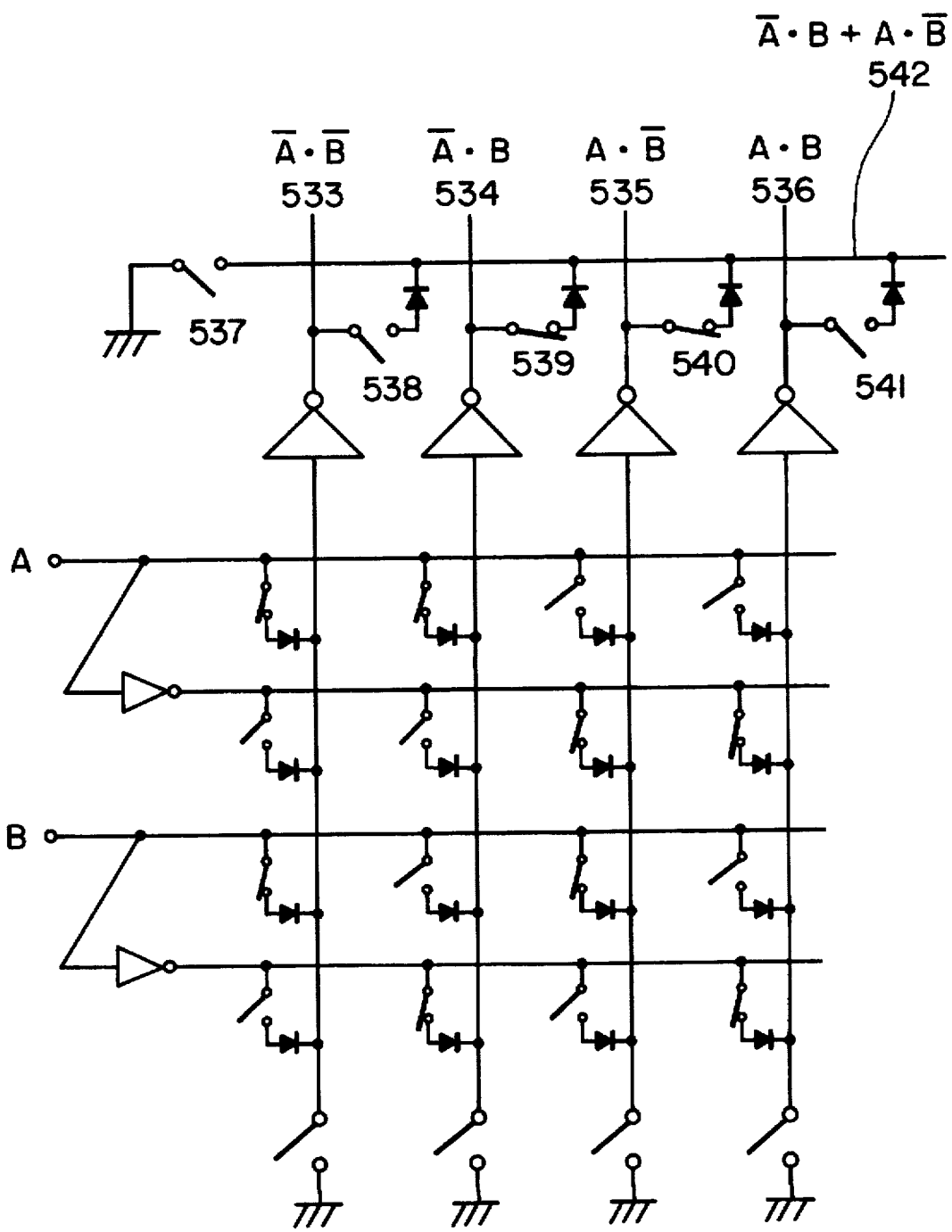
FIG. 26 is a circuit diagram showing the semiconductor device of the fourteenth embodiment.

FIG. 26 shows an example of realizing exclusive logical OR between, for instance two inputs by using the circuit for calculating logical AND in FIG. 25 and the circuit for calculating logical OR in FIG. 24. 533, 534, 535 and 536 are the same output lines as in FIG. 25. Connections between these lines and an output line 534 are determined by combinations 538, 539, 540 and 541 of switches and diodes. Since in this example wirings 534 and 535 are connected to a wiring 542, logical OR between 534 and 535 is outputted to 542.

Therefore, as for the inputs A and B, exclusive logical OR between A and B appears in the wiring 542.

All logical calculations can be performed by means of combinations between AND an OR. Optional logical functions can be realized by combining a logical plane for AND and that for OR, as in the above. Though reference was made to the example of exclusive logical OR here, it is possible to realize an optional logical function of optional inputs by using AND and OR planes of multiinputs and multioutputs.

Moreover, it is needless to say that a circuit for inputting an optional group of signals and outputting an optional group of signals corresponding thereto one to one can be made by using AND and OR planes of multiinputs and multioutputs.

These logic circuits are based on the same concept as PLA shown in FIG. 18(a). A difference is that the functions of the AND and OR circuits in FIG. 18(a) are realized by ROM itself.

(Embodiment 15)

Figure 27:
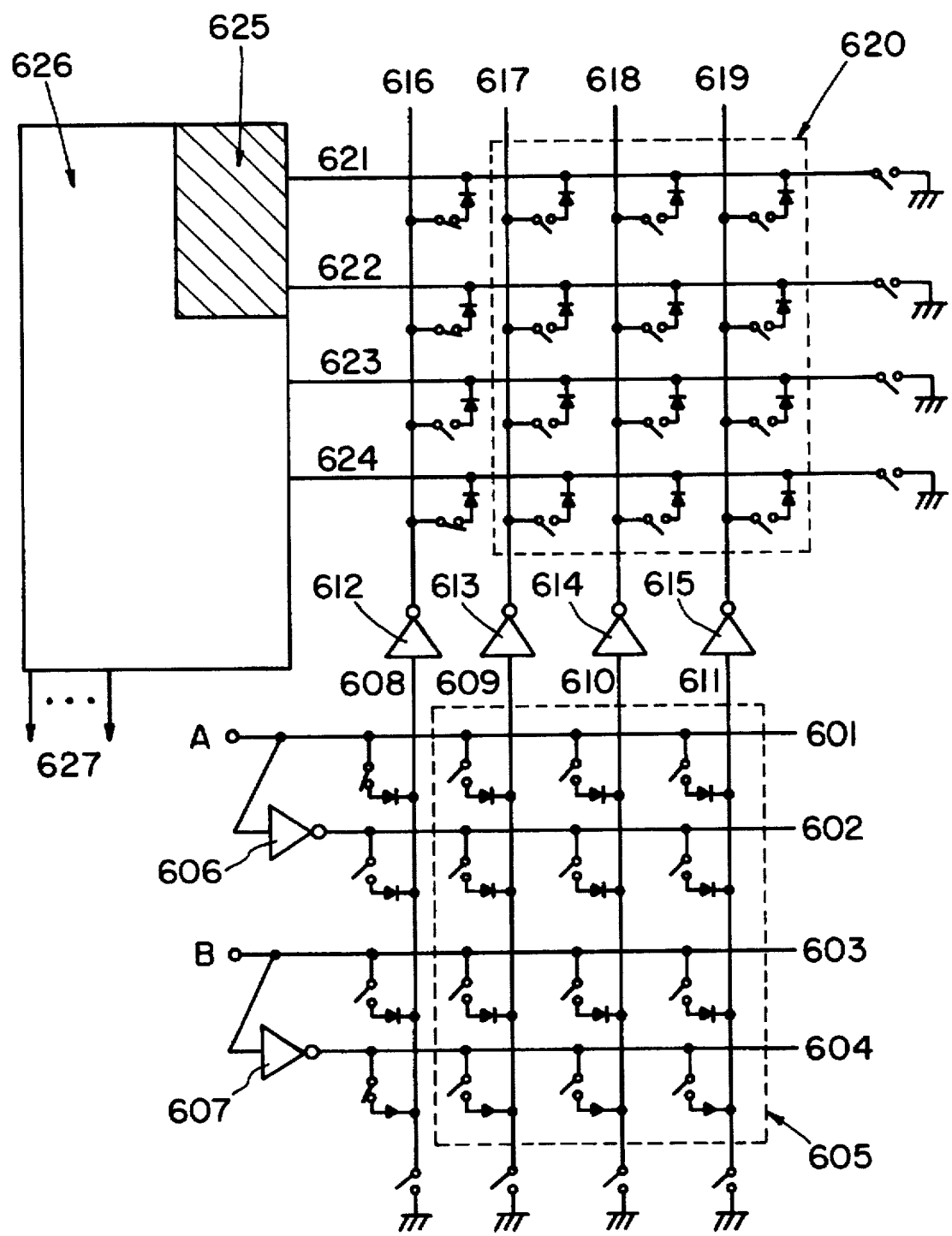
FIG. 27 is an exemplary view showing a data retrieval system using the ROM of the invention.

The fifteenth embodiment of the invention is shown in FIG. 27. FIG. 27 shows a data retrieval system using ROM. As an example of the data retrieval system, there is available a library retrieval. This is a system for outputting, for instance all related books, by inputting only fields and names of writers one wishes to read out of an immense number of books. Conventionally, in a system of this type, it has been difficult to attain high speeds for data accessing and calculation processing, because a great deal of library data stored in a magnetic storage medium and a compact disk was retrieved on software. In order to store a great deal of library data on hardware to which high-speed accessing is allowed, ROM having an extremely high density is necessary. In addition, this ROM needs to be programmable ROM of a type which allows a user to write information later and thus high-density programmable ROM to which high-speed accessing can be made is necessary.

A characteristic of a retrieval system in the embodiment lies in the fact that not only a medium for storing information is realized by high-speed and high-density ROM but also a calculating part itself for calculating which data is to be outputted based on inputted data is realized by high-speed an high-density ROM.

In FIG. 27, information of "1, 0, 0, 1" is written in four memory elements connected to a wiring 608, and because of this the wiring 608 is "0" and a wiring 616 is "1" only when A is "0" and B is "1".

Information of "1, 1, 0, 1" is written in the four memory elements connected to the wiring 616, and when the wiring 616 is "1", "1, 1, 0, 1" is outputted to wirings 621, 622, 623 and 624.

If this output information is one for indicating an address of, for instance 625 part in ROM 626, the information of 625 can be outputted to an output line 627.

A series of these operations makes it possible to read information in ROM corresponding to certain inputs A and B. If these inputs A and B indicate a writer's name of books, all the books by this writer are written in the part 625 in ROM 626 and an address thereof is written in a memory cell connected to the wiring 616, by inputting the name of the writer the books are automatically outputted.

In this system all the parts excluding peripheral circuits such as an inverter and the like can be composed by the same structure and thus designing is very easy. In the case of adding data to ROM 626, it is only necessary to write anew information corresponding to an added address in unused parts 605 and 620.

For instance, by rewriting all bits of information stored in the memory cell connected to 608 to "1", the wiring 608 becomes always "1" and the wiring 616 is kept always at "0" for all the combinations of A and B inputs. That is, accessing to information (address) stored in the memory connected to the wiring 616 is impossible. When data which has been once written is to be rewritten whole anew, data may be written anew in an unused part after accessing to the old data is made impossible by means of this method.

The example of the library retrieval system was described above. As for the inputs A and B, codes of calculating commands may be inputted and a procedure for executing these commands may be stored in, for instance ROM 625. It is also possible to write various kinds of application software conventionally stored in the magnetic medium in ROM and input command codes for stating the software in the inputs A and B. When the version of the application software is to improved and new software is to be installed again, this can be newly installed by making it impossible to access the old address according to the above-described method.

It is needles to say that the inputs A and B need not be 2 bit, but optional bit number can be selected and the size of the system can be optional.

(Embodiment 16)

Figure 28:
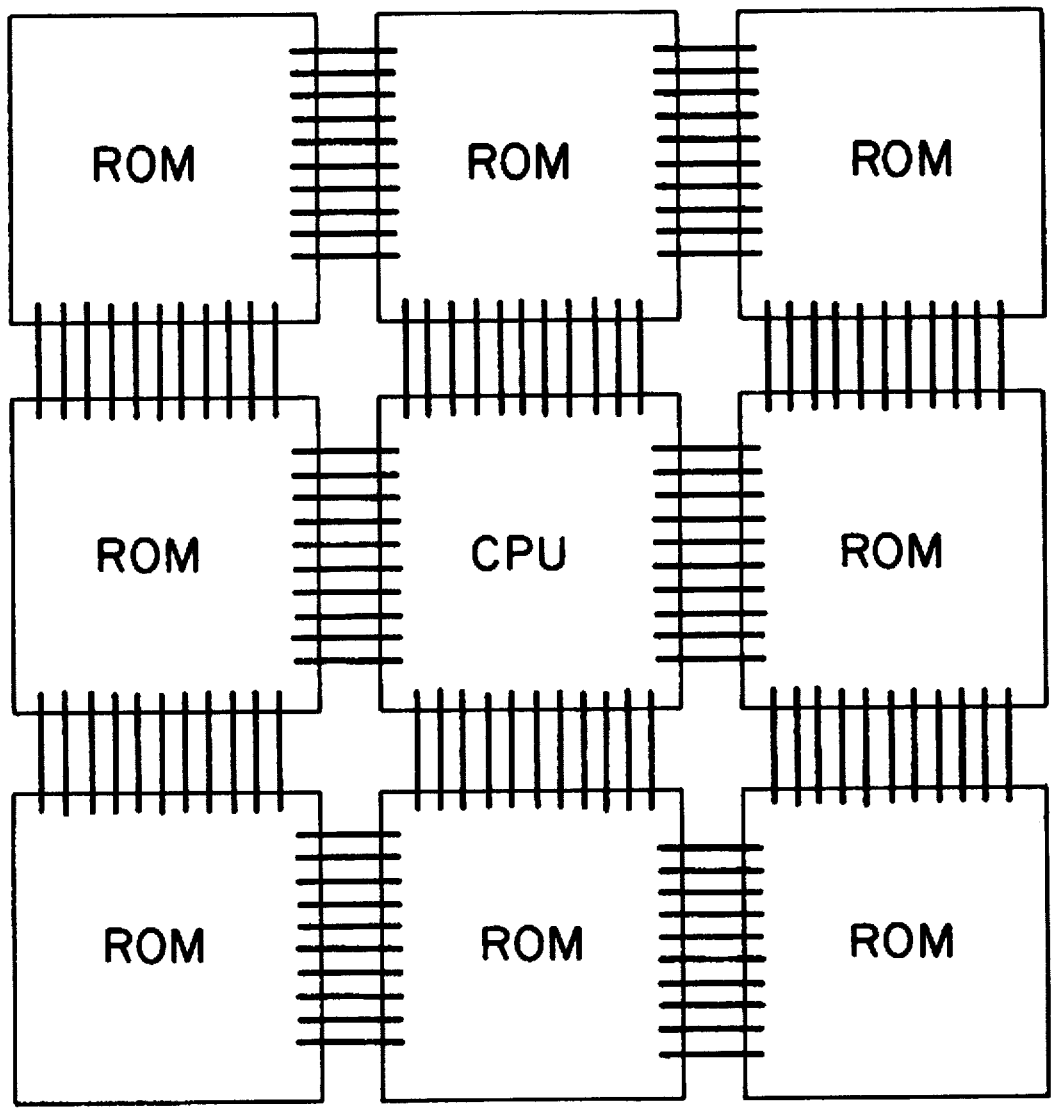
FIG. 28 is an exemplary view showing a hybrid type system using the ROM of the invention.
Figure 29A:
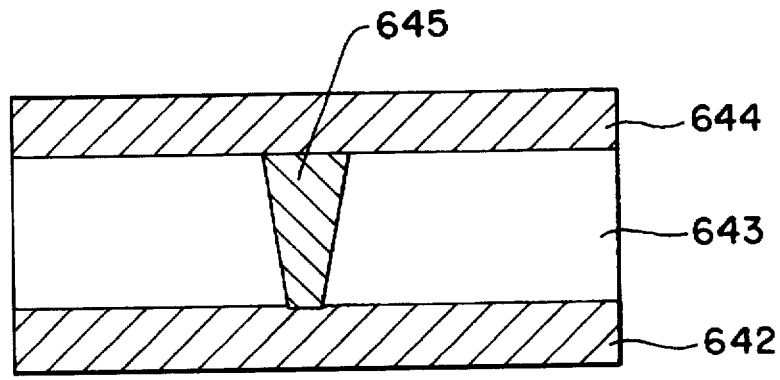
FIG. 29 is an exemplary sectional view showing the form of a silicide region.
Figure 29B:
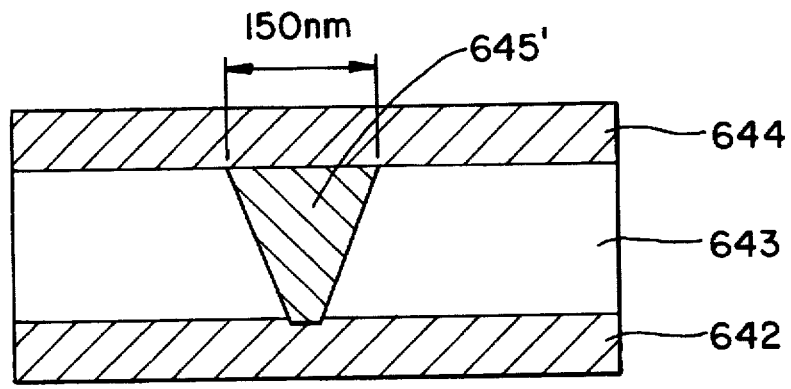
Figure 29C:
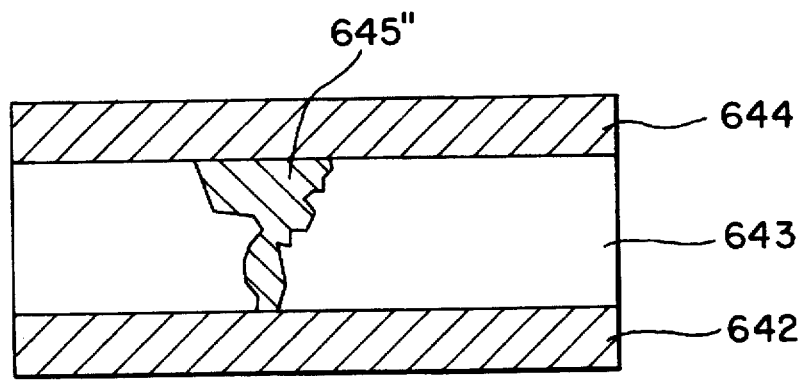

The sixteenth embodiment of the invention is shown in FIG. 28.

FIG. 28 shows a hybrid type system wherein a highly integrated and high-speed ROM devised by the invention is disposed around a chip having a CPU within and connected directly by a bonding wire. CPU instruction codes and various kinds of application software may be all written in this ROM. Also, ROM having the above-described data retrieving function may be disposed around the chip.

It is almost impossible to use a magnetic disk or a compact disk as a storage medium in a palm-size portable information equipment interims of miniaturization and thus it is necessary to directly dispose a highly integrated electronic storage medium like that devised by the invention around an operation processor highly densely.

INDUSTRIAL APPLICABLE FIELD

According to the invention, it is possible to provide a low resistance and highly reliable antifuse. That is, an occurrence rate of failures can be limited by forming a silicide region with 150 nm or less in width and a highly reliable antifuse can be provided. Thus, it is possible to inexpensively provide a programmable logic array (PLA) capable of realizing an optional function, a field programmable gate array (FPGA) capable of optionally connecting wirings among a number of calculating units and a semiconductor device of high-speed and highly dense ROM and also to inexpensively provide an extremely small sound and video recording medium replacing a magnetic tape and a compact disk.

What is claimed is:

1. A semiconductor device utilizing a silicide reaction in which are provided a plurality of cells each having a semiconductor layer between a pair of conductors at least one of said pair of conductors is made of metal, the semiconductor layer between said at least pair of conductors made of amorphous silicon which silicide reacts with the metal of said conductors at a reaction speed of 10 m/sec or more to form a silicide region having a width of less than 150 nm.

2. A semiconductor device utilizing a silicide reaction in which are provided a plurality of cells each having a semiconductor layer disposed between a pair of conductors, the semiconductor layers made of amorphous silicon, at least one said pair of conductors made of a metal which silicide reacts with said amorphous silicon to form a silicide region with one of a truncated conical-shaped and pyramid shaped structure and having a width of less than 150 nm.

3. A semiconductor device utilizing a silicide reaction in which a plurality of cells are provided which each have a semiconductor layer between a pair of conductors, the semiconductor layer is made of amorphous silicon, at least one of the pair of conductors is made of metal which silicide reacts with the amorphous silicon to form a silicide region having a width of less than 150 nm, and the surface of the semiconductor or the metal is not exposed to an oxygen-containing atmosphere between a process for forming the amorphous silicon and a process for forming the metal.

4. A semiconductor device utilizing a silicide reaction according to claim 1, wherein a thickness of the amorphous silicon is from 50 to 150 nm.

5. A semiconductor device utilizing a silicide reaction according to claim 1, wherein the amorphous silicon layer is injected with ions.

6. A semiconductor device utilizing a silicide reaction according to claim 5, wherein the amorphous silicon layer is a layer injected with ions via the metal.

7. A semiconductor device utilizing a silicide reaction according to claim 1, wherein a surface of the semiconductor device is covered by an insulating film formed at a film forming temperature of 250° or less.

8. A semiconductor device utilizing a silicide reaction according to claim 1, wherein by supplying a current to the amorphous silicon layer through the pair of conductors, a silicide reaction is generated between the metal and the amorphous silicon and between the pair of conductors is electrically short-circuited.

9. A semiconductor device utilizing a silicide reaction according to claim 8, wherein the current flows from the amorphous silicon layer into the metal.

10. A semiconductor device utilizing a silicide reaction according to claim 1, wherein the pair of conductors are both made of metal.

11. A semiconductor device utilizing a silicide reaction according to claim 1, wherein the metal is a compound of a high melting point metal or an alloy including a high melting point metal.

12. A semiconductor device utilizing a silicide reaction according to claim 1, wherein the metal includes at least one of Ta, Ti, Co, Hf, Ni, Zr, Cr, V, Pd and Pt.

13. A semiconductor device utilizing a silicide reaction according to claim 1, characterized by being formed by self-alignment.

14. A semiconductor device utilizing a silicide reaction according to claim 1, wherein the semiconductor device is formed by self-alignment by means of a technique of selecting and growing a metal or semiconductor.

15. A semiconductor device utilizing a silicide reaction according to claim 14, wherein the semiconductor device is formed by self-alignment by means of a technique of selecting and growing W or Ti and silicon.

16. A semiconductor device utilizing a silicide reaction according to claim 1, further provided with means for electrically detecting a change in resistance between the pair of conductors.

17. A semiconductor device utilizing a silicide reaction according to claim 1, further provided with means for detecting a change in resistance between the pair of conductors by means of the silicide reaction and means for finishing the reaction after detection.

18. A semiconductor device utilizing a silicide reaction according to claim 1, wherein by inputting a pulse to one of the pair of conductors via a capacitor and instantaneously increasing a potential difference between the pair of conductors, breakdown of the amorphous silicon is generated.

19. A semiconductor device utilizing a silicide reaction according to claim 1, wherein the cells are provided with a second semiconductor layer having a flow-rectifying characteristic between the semiconductor layer and the conductors or on a side opposite the semiconductor layer of the conductors.

20. A semiconductor device utilizing a silicide reaction according to claim 19, wherein a structure indicating the flow-rectifying characteristic is a PN connection.

21. A semiconductor device utilizing a silicide reaction according to claim 19, wherein a structure indicating the flow-rectifying characteristic is a Schottky connection.

22. A semiconductor device utilizing a silicide reaction according to claim 19, wherein the second semiconductor area has a structure with a resistance smaller than that of the semiconductor layer.

23. A semiconductor device utilizing a silicide reaction according to claim 22, wherein the semiconductor layer is made of nondoped amorphous silicon or amorphous silicon in which boron is doped to a specified amount and the second semiconductor layer is made of silicon in which impurities are doped.

24. A semiconductor device utilizing a silicide reaction according to claim 19, wherein the second semiconductor area has a structure made of a semiconductor material whose silicide reaction speed is slower than that of the first semiconductor area.

25. A semiconductor device utilizing a silicide reaction according to claim 24, wherein the semiconductor layer is amorphous silicon formed by means of ion injection and the second semiconductor layer is an amorphous silicon deposition film deposited by means of a vapor deposition method or a crystalline silicon.

26. A semiconductor device utilizing a silicide reaction according to claim 19, wherein a part of one of the pair of conductors adjacent to and in contact with the second semiconductor is formed of a metal which does not form a silicide layer by reacting with the second semiconductor area.

27. A semiconductor device utilizing a silicide reaction according to any of claim 1, wherein a plurality of first electrically conductive wirings and a plurality of second electrically conductive wirings are disposed in a matrix form and the cells are provided on an intersecting portion between the pluralities of first and second electrically conductive wirings.

28. A semiconductor device utilizing a silicide reaction according to claim 27, wherein the first electrically conductive wirings and the conductors adjacent thereto are formed of the same material and/or the second electrically conductive wirings and the conductors adjacent thereto are formed of the same material.

29. A semiconductor device utilizing a silicide reaction according to claim 27, wherein the electrical detecting means is provided with means for disabling detection of a change in resistance between the pair of conductors.

30. A semiconductor device utilizing a silicide reaction according to claim 1, wherein the semiconductor device is a read-only memory.

31. A semiconductor device utilizing a silicide reaction according to claim 30, wherein the read-only memory is capable of storing data of 1 gigabit or higher.

32. A semiconductor device utilizing a silicide reaction according to claim 30, wherein the read-only memory is one from which data can be read in 20 nsec or less.

33. A semiconductor device utilizing a silicide reaction according to claim 1, wherein electrical connection and insulation between optional wirings can be arbitrarily determined by means of the silicide reaction after a manufacturing process is finished and thus a circuit function of a programmable logic array (PLA) or a field programmable gate array (FPGA) can be arbitrarily set.

34. A semiconductor device utilizing a silicide reaction according to any one of claim 1, wherein connection and insulation between a gate electrode of a MOS transistor and a power source or a grounding electrode can be arbitrarily determined by means of the silicide reaction after manufacturing is finished.

35. A semiconductor device utilizing a silicide reaction according to claim 1, wherein connection and insulation between a source electrode and/or a drain electrode of the MOS transistor and a grounding electrode can be arbitrarily determined by means of the silicide reaction after manufacturing is finished.

36. A semiconductor device utilizing a silicide reaction according to claim 1, wherein in a neuron MOS transistor having a semiconductor area of one conductivity type on a base plate, source and drain areas of opposite conductivity types provided in this area, a floating gate electrode provided in an area in which the source and drain areas are separated via the insulating film and in an electrically floating state and a plurality of input gate electrodes capacitive-coupled via the floating gate electrodes and the insulating film, connection and insulation between the plurality of input gate electrodes and the power source or the grounding electrode can be arbitrarily determined by means of the silicide reaction after manufacturing is finished.

37. A semiconductor device utilizing a silicide reaction according to claim 1, wherein the silicide reaction is generated while cooling a base plate temperature by means of a liquid or a gas.

\* \* \* \* \*

UNITED STATES PATENT AND TRADEMARK OFFICE
CERTIFICATE OF CORRECTION

PATENT NO. : 5,714,795
DATED : February 3, 1998
INVENTOR(S) : Tadahiro Ohmi, Hiroshi Suzuki and Masaki Hirayama It is certified that error appears in the above-identified patent and that said Letters Patent are hereby corrected as shown below:

Claim 27, Col. 34, Line 39, delete "any of claim 1" and insert --claim 1--.
Claim 34, Col. 35, Line 5, delete "any of claim 1" and insert --claim 1--.

Signed and Sealed this

Second Day of June, 1998

Attest:

BRUCE LEHMAN

Attesting Officer      Commissioner of Patents and Trademarks